(12) United States Patent
Kajigaya

(10) Patent No.: US 8,472,272 B2
(45) Date of Patent: Jun. 25, 2013

(54) SEMICONDUCTOR DEVICE HAVING HIERARCHICAL BIT LINE STRUCTURE

(75) Inventor: Kazuhiko Kajigaya, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 51 days.

(21) Appl. No.: 13/373,006

(22) Filed: Nov. 2, 2011

(65) Prior Publication Data

US 2012/0113736 A1    May 10, 2012

(30) Foreign Application Priority Data

Nov. 4, 2010   (JP) ................. 2010-247947

(51) Int. Cl.
*G11C 7/12*    (2006.01)
*G11C 7/06*    (2006.01)
(52) U.S. Cl.
USPC ............................ 365/203; 365/63; 365/207
(58) Field of Classification Search
None
See application file for complete search history.

(56) References Cited

U.S. PATENT DOCUMENTS

| | | | |
|---|---|---|---|
| 6,333,866 B1 | 12/2001 | Ogata | |
| 6,580,629 B2 | 6/2003 | Ogata | |
| 6,768,663 B2 | 7/2004 | Ogata | |
| 7,317,649 B2 | 1/2008 | Kajigaya | |
| 7,460,388 B2 | 12/2008 | Ilda | |
| 7,471,558 B2 | 12/2008 | Kajigaya | |
| 7,697,358 B2 | 4/2010 | Kajigaya | |
| 7,701,794 B2 | 4/2010 | Kajigaya | |
| 2007/0242539 A1* | 10/2007 | Ilda | ............... 365/203 |

FOREIGN PATENT DOCUMENTS

| | | |
|---|---|---|
| JP | 8-87880 | 4/1996 |
| JP | 2000-114491 A | 4/2000 |
| JP | 2006-286090 A | 10/2006 |
| JP | 2007-287209 A | 11/2007 |
| JP | 2008-262632 A | 10/2008 |
| JP | 2008-294310 A | 12/2008 |

* cited by examiner

*Primary Examiner* — Hoai V Ho
*Assistant Examiner* — James G Norman
(74) *Attorney, Agent, or Firm* — McGinn IP Law Group, PLLC

(57) ABSTRACT

A semiconductor device of the invention comprise a memory cell array configured with hierarchical local bit lines and global bit lines, in which there are provide local bit lines, global bit lines, switches controlling a connection between the global bit lines, sense amplifiers, and a control circuit controlling the switches. In a first period, each sense amplifier amplifies a signal of one of adjacent global bit lines, and in a second period, each sense amplifier amplifies a signal of the other thereof. Accordingly, coupling between the global bit lines can be suppressed.

18 Claims, 17 Drawing Sheets

(FIRST PRECHARGE PERIOD)

(FIRST ACTIVE PERIOD)

(SECOND PRECHARGE PERIOD)

(SECOND ACTIVE PERIOD)

FIG.14 (FIRST PRECHARGE PERIOD)

(FIRST ACTIVE PERIOD)

(SECOND PRECHARGE PERIOD)

(SECOND ACTIVE PERIOD)

SEMICONDUCTOR DEVICE HAVING HIERARCHICAL BIT LINE STRUCTURE

BACKGROUND OF THE INVENTION

1. Field of the Invention

The invention relates to a semiconductor device comprising a memory cell array in which a bit line structure is hierarchized using global bit lines and local bit lines.

2. Description of Related Art

In recent years, miniaturization of a memory cell array has been achieved in volatile semiconductor devices such as DRAM, and thus in order to overcome a performance problem caused by an increase in the number of memory cells connected to a bit line, a configuration in which the bit lines are hierarchized into global bit lines and local bit lines has been proposed. It is required to reduce memory cell size to, for example, 6F2 or 4F2 ("F" is minimum manufacturing scale), and a bit line pitch in this case needs to be set to 2F that is a manufacturing limit. Meanwhile, in a memory cell array having a hierarchical bit line structure, respective memory cells need to be refreshed in a refresh operation such as an auto refresh mode or a self refresh mode in a predetermined period in order to retain data of the memory cells, in the same manner as the conventional configuration. Particularly, in a memory cell array employing the hierarchical bit line structure in the DRAM, it is required to suppress an increase in consumption current in the refresh operation that is caused by an increase in the number of memory cells. Also, it is required to prevent a reduction in sensing margin of sense amplifiers that is caused by a decrease in memory cell capacitance due to the miniaturization of the DRAM.

For example, Patent Reference 1 discloses a technique in which each bit line pair is divided into left and right portions at an approximate center thereof, one word line is selected for refreshing in each of the left and right portions, and a sense amplifier is arranged for each one of a set of portions of even-numbered and odd-numbered bit line pairs, and the refresh operation is performed being divided into two operations in chronological order, in order to reduce the consumption current in the refresh operation. However, when applying the technique disclosed in Patent Reference 1 to memory cells of small size such as 6F2 cell size or 4F2 cell size, it is required to employ an open bit line structure or a single-ended structure that are capable of reducing the bit line pitch.

Meanwhile, for example, Patent References 2 and 3 disclose techniques of a hierarchical sense amplifier for the purpose of preventing the reduction in sensing margin that is caused by the decrease in memory cell capacitance. In this case, a configuration in which the techniques of Patent References 2 and 3 are combined with the technique of Patent Reference 1 can be available to reduce the consumption current in the refresh operation. However, in such a configuration, there arises a problem that the sensing margin in the refresh operation is reduced by influence of coupling noise between adjacent global bit lines in the hierarchical bit line structure.

In order to deal with the above problem, for example, Patent References 4 and 5 disclose techniques in which local bit lines having an open bit line structure and global bit lines having a folded bit line structure are arranged and connected to each other and signals thereof are sensed and amplified for the purpose of cancelling common mode noise for each pair of global bit lines. Further, for example, Patent Reference 6 discloses a technique in which the local bit lines and the global bit lines are used for sensing and amplifying in the same manner as in Patent References 4 and 5, and additionally a precharge voltage is supplied to non-selected global bit lines until just before the amplifying by the sense amplifiers for the purpose of suppressing noise between adjacent bit lines in a read operation. Furthermore, Patent Reference 6 discloses a technique for cancelling the coupling noise from a pair of adjacent global bit lines by twisting the global bit lines.

[Patent Reference 1] Japanese Patent Application Laid-open No. 2006-286090 (U.S. Pat. No. 7,317,649)
[Patent Reference 2] Japanese Patent Application Laid-open No. 2008-262632 (U.S. Pat. No. 7,697,358)
[Patent Reference 3] Japanese Patent Application Laid-open No. 2008-294310 (U.S. Pat. No. 7,701,794)
[Patent Reference 4] Japanese Patent Application Laid-open No. H8-87880
[Patent Reference 5] Japanese Patent Application Laid-open No. 2000-114491 (U.S. Pat. No. 6,333,866)
[Patent Reference 6] Japanese Patent Application Laid-open No. 2007-287209 (U.S. Pat. No. 7,460,388)

According to the techniques disclosed in Patent References 4 and 5, the coupling noise from a pair of adjacent global bit lines cannot be cancelled. Further, according to the technique disclosed in Patent Reference 6, although the coupling noise can be cancelled, it is necessary to arrange two (a pair) global bit lines corresponding to one local bit line. Therefore, inevitably size of each memory cell cannot be set lower than twice the pitch of global bit lines, therefore a reduction in size of the memory cell is restricted. For example, even if the global bit lines can be arranged with a minimum pitch of 2F, the size of the memory cell needs to be 8F2 (2×2F×2F) and inevitably becomes larger than 6F2 and 4F2. Further, as disclosed in Patent Reference 6, when twisting the global bit lines, an increase in area of the memory cell array is caused by this twisting. In this manner, in the conventional memory cell array employing the hierarchical bit line structure, it is difficult to achieve the reduction in size of the memory cells, the reduction in consumption current in the refresh operation, and prevention of the reduction in sensing margin due to the coupling noise, at the same time.

SUMMARY

One of aspects of the invention is a semiconductor device comprising a memory cell array configured with hierarchical local bit lines and global bit lines, the device comprising: first to fourth local bit lines respectively transmitting first to fourth signals corresponding to first to forth memory cells that are selected simultaneously; first to fourth global bit lines respectively corresponding to the first to fourth local bit lines; a first switch controlling a connection between one end of the first global bit line and one end of the second global bit line; a second switch controlling a connection between one end of the third global bit line and one end of the fourth global bit line; first and second sense amplifiers; a third switch selectively connecting one of the other ends of the first and third global bit lines to the first sense amplifier; a fourth switch selectively connecting one of the other ends of the second and fourth global bit lines to the second sense amplifier; fifth to eighth switches connecting between the first to fourth local bit lines and the first to fourth global bit lines respectively; and a control circuit controlling the first to eighth switches. In the semiconductor device, the first and third global bit lines are physically adjacent to each other and the second and fourth global bit lines are physically adjacent to each other. In a first period, the control circuit performs a first operation in which the first sense amplifier amplifies the first signal and a second operation in which the second sense amplifier amplifies the second signal, the first and second operations being performed in a state where the first and second global bit lines are electrically disconnected from each other by the first switch, the third and fourth global bit lines are electrically connected to each other via the second switch, the fifth and sixth switches become conductive, the seventh and eighth switches become non-conductive, the third and fourth global bit lines are set to a predetermined potential, the first global bit line is electrically connected to the first sense amplifier via the third switch, and the second global bit line is electrically connected to the second sense amplifier via the fourth switch. In a second period different from the first period, the control circuit further performs a third operation in which the first sense amplifier amplifies the third signal and a fourth operation in which the second sense amplifier amplifies the fourth signal, the third and fourth operations being performed in a state where the first and second global bit lines are electrically connected to each other via the first switch, the third and fourth global bit lines are electrically disconnected from each other by the second switch, the seventh and eighth switches become conductive, the fifth and sixth switches become non-conductive, the first and second global bit lines are set to the predetermined potential, the third global bit line is electrically connected to the first sense amplifier via the third switch, and the fourth global bit line is electrically connected to the second sense amplifier via the fourth switch.

According to the semiconductor device of the invention, an operation of the first and second global bit lines divided by the first switch and an operation of the third and fourth global bit lines divided by the second switch are performed in periods different from each other. That is, in the first period, signals corresponding to two bits that are read through the first and second local bit lines are amplified by the first and second sense amplifiers through the first and second global bit lines, and in the second period, signals corresponding to two bits that are read through the third and fourth local bit lines are amplified by the first and second sense amplifiers through the third and fourth global bit lines. Thereby, when performing a refresh operation of the memory cell array, for example, coupling noise between adjacent global bit lines can be suppressed, and thus it is possible to reduce consumption current without a decrease in sensing margin.

The invention may be applied to a memory cell array having a single-ended bit line configuration, or to a memory cell array having an open bit line structure. Further, when the first and second global bit lines are arranged along the same line in a first direction and the third and fourth global bit lines are arranged along the same line in the first direction with a predetermined pitch relative to the first and second global bit lines, a sufficient effect of suppressing the coupling noise can be obtained. Furthermore, when performing the refresh operation for retaining data of the memory cells as the first to fourth operations, the effect of the invention becomes remarkable. The refresh operation may be an auto refresh mode or a self refresh mode. However, the first to fourth operations are not limited to the refresh operation and may be a read operation or a write operation, to which the invention can be also applied.

As described above, according to the present invention, in order to deal with the problem of an increase in coupling noise between the adjacent global bit lines due to an increase in coupling capacitance therebetween with the miniaturization of the memory cell array having the hierarchical bit line structure, it is possible to perform the operation being divided into two parts in the first and second periods, and in the operation for one global bit line, the other global bit line can be used as a shield. Therefore, it is possible to suppress a decrease in sensing margin due to the coupling noise between the adjacent global bit lines, and to reduce the capacitance of the global bit lines to substantially half by the first and second switches. Thus, large effects of an increase in sensing margin in the refresh operation and a reduction in consumption current can be obtained with decreasing the size of the memory cells.

Further, by employing the configuration of the invention, the global bit lines do not need to be configured with the folded bit line structure and to be twisted, and therefore it is possible to obtain effects of an increase in sensing margin and a reduction in consumption current without an increase in chip area. Further, when employing the single-ended memory cell array, the invention can be effectively applied to a configuration including shared type global sense amplifiers.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

A typical example of a technical idea solving the problems of the present invention will be shown below. However, it goes without saying that the present invention is not limited to the example of the technical idea and should be construed based on the disclosure of the claims.

Figure 1:
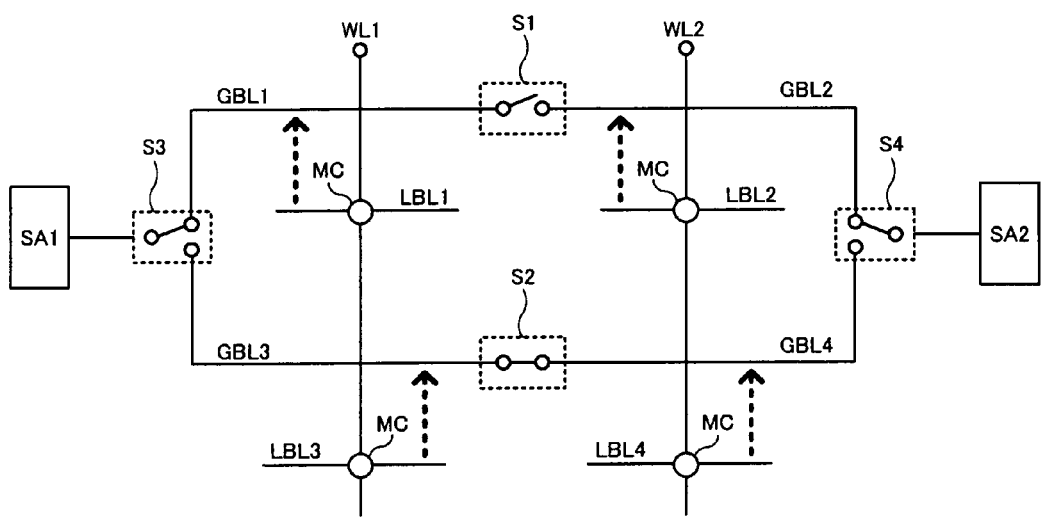
FIG. 1 is a principle diagram showing a technical idea of the invention.

As shown in FIG. 1, an example of the technical idea of the invention is applied to a semiconductor device having a bit line structure hierarchized using global bit lines GBL and local bit lines LBL. A first global bit line GBL1 is selectively connected to a first local bit line LBL1, a second global bit line GBL2 is selectively connected to a second local bit line LBL2, and a connection between the first and second global bit lines GBL1 and GBL2 is controlled by a first switch S1. Further, a third global bit line GBL3 is selectively connected to a third local bit line LBL3, a fourth global bit line GBL4 is selectively connected to a fourth local bit line LBL4, and a connection between the third and fourth global bit lines GBL3 and GBL4 is controlled by a second switch S2. A connection between a first sense amplifier SA1 and two global bit lines GBL1 and GBL3 is selectively controlled by a third switch S3. A connection between a second sense amplifier SA2 and two global bit lines GBL2 and GBL4 is selectively controlled by a fourth switch S4. In addition, FIG. 1 exemplifies one word line WL1 in an area of the global bit lines GBL1 and GBL3 and one word line WL2 in an area of the global bit lines GBL2 and GBL4, and exemplifies four memory cells MC at intersections of the word lines WL1 and WL2 and each of the local bit lines LBL1 to LBL4. The word lines WL1 and WL2 are simultaneously selected. Then, four pieces of data are transmitted from the four memory cells MC to the corresponding local bit lines LBL1 to LBL4, respectively.

In the configuration shown in FIG. 1, in a first period, the first and second global bit lines GBL1 and GBL2 are disconnected from each other by the first switch S1, the third and fourth global bit lines GBL3 and GBL4 are connected to each other via the second switch S2, and the first and second global bit lines GBL1 and GBL2 are connected to the first and second sense amplifiers SA1 and SA2 on both sides via the third and fourth switches S3 and S4. Then, in this state, signals are amplified by the first and second sense amplifiers SA1 and SA2 through respective paths. Meanwhile, in a second period, the third and fourth global bit lines GBL3 and GBL4 are disconnected from each other by the second switch S2, the first and second global bit lines GBL1 and GBL2 are connected to each other via the first switch S1, and the third and fourth global bit lines GBL3 and GBL4 are connected to the first and second sense amplifiers SA1 and SA2 on both sides via the third and fourth switches S3 and S4. Then, in this state, signals are amplified by the first and second sense amplifiers SA1 and SA2 through respective paths. By controlling in this manner, the signals corresponding to 4 bits, for example, can be amplified by the sense amplifiers SA1 and SA2 on both sides, each of which is divided into two operations each corresponding to one bit. Therefore, when performing the refresh operation or the like, it is possible to obtain a remarkable effect of suppressing the coupling noise between the adjacent global bit lines.

Preferred embodiments of the invention will be described in detail below with reference to accompanying drawings. In the following embodiments, the present invention is applied to a DRAM (Dynamic Random Access Memory) as an example of the semiconductor device.

First Embodiment

Figure 2:
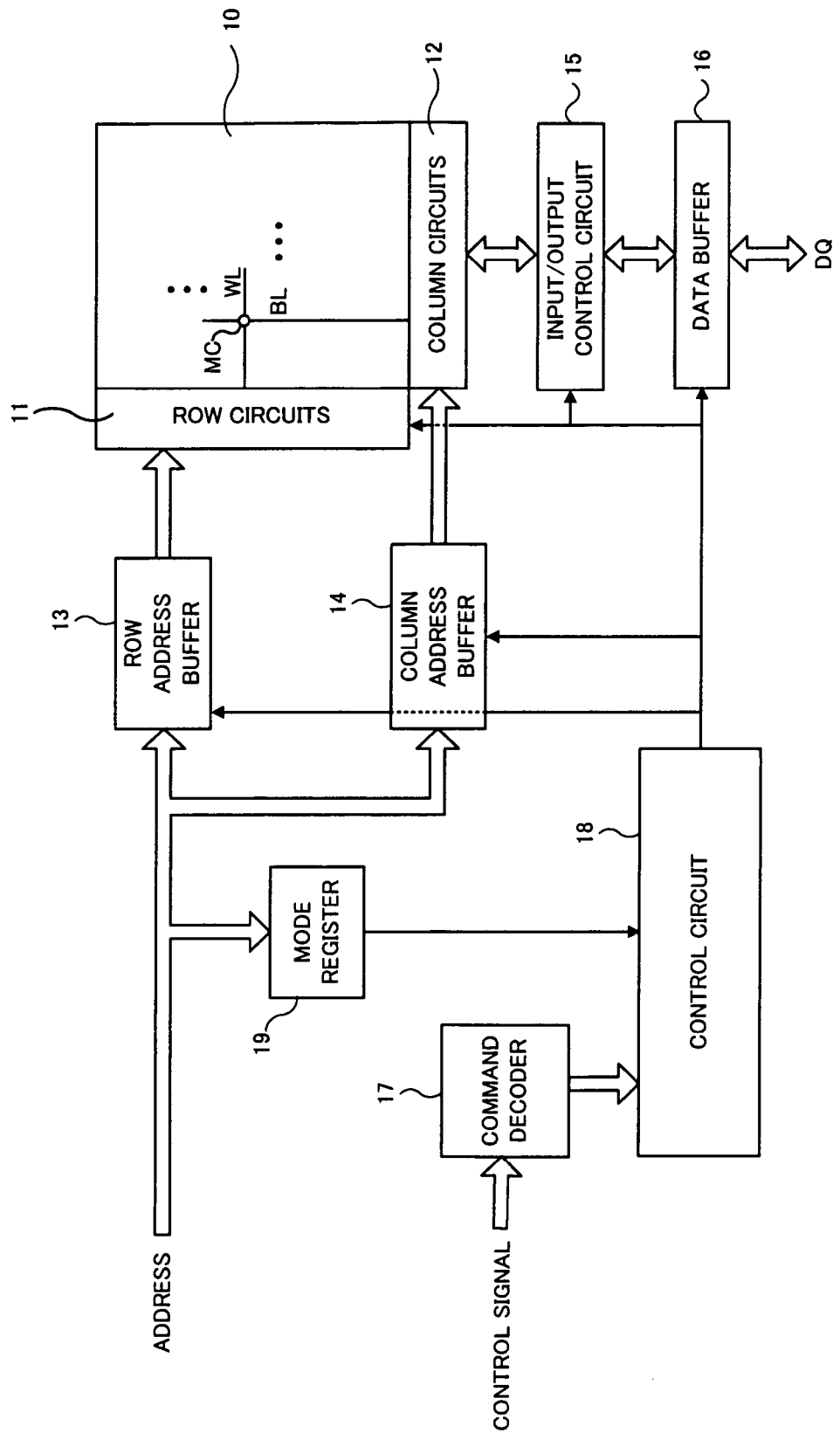
FIG. 2 is a block diagram showing an entire configuration of a DRAM of a first embodiment.

FIG. 2 is a block diagram showing an entire configuration of a DRAM of a first embodiment to which the invention is applied. The DRAM shown in FIG. 2 comprises a memory cell array 10 including a large number of memory cells MC arranged at intersections of a plurality of word lines WL and a plurality of bit lines BL (later describe local bit lines LBL), and row circuits 11 and column circuits 12 that are attached to the memory cell array 10. The row circuits 11 includes a large number of circuits provided corresponding to the plurality of word lines WL, and the column circuits 12 includes a large number of circuits provided corresponding to the plurality of bit lines BL. In addition, since the first embodiment employs a hierarchical bit line structure, the bit lines BL of the memory cell array 10 are hierarchized into global bit lines GBL of an upper hierarchy and local bit lines LBL of a lower hierarchy, which will be described in detail later.

Externally input addresses includes a row address and a column address, the row address is stored in a row address buffer 13 and sent to the row circuits 11, and the column address is stored in a column address buffer 14 and sent to the column circuits 12. Data transfer between the column circuits 12 and a data buffer 16 is controlled by an input/output control circuit 15, and the data is transferred from/to outside via input/output data terminals (DQ).

A command decoder 17 determines a command for the DRAM based on externally input control signals and sends the command to a control circuit 18. The control circuit 18 controls operations of respective parts of the DRAM according to a command type determined by the command decoder 17. The control circuit 18 controls the operations in conjunction with an internal clock generated by a clock generation circuit (not shown). Further, a mode register 19 selectively sets operation modes of the DRAM based on the above addresses and sends setting information to the control circuit 18. In the embodiments, not only normal operations such as a read operation and a write operation are controlled by the control circuit 18, but also refresh operations for retaining data of the memory cell array 10 are controlled by the control circuit 18. The refresh operations includes an auto refresh performed in response to a refresh command from outside in a normal operation and a self refresh automatically performed with a predetermined time interval in standby mode.

Figure 3:
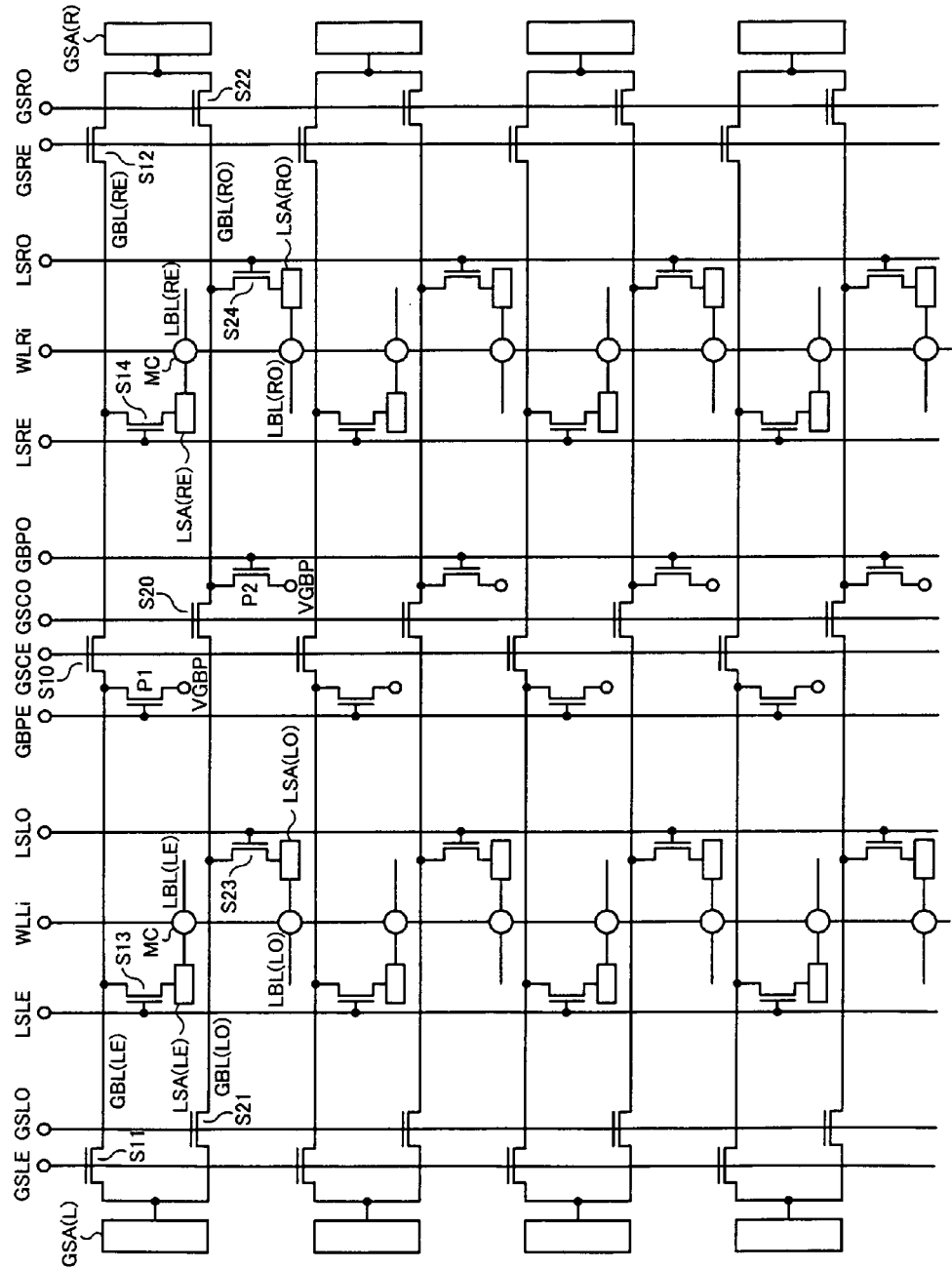
FIG. 3 is a diagram showing a configuration of a memory cell array and its peripheral portion in the DRAM of the first embodiment.

Next, FIG. 3 is a diagram showing a configuration of the memory cell array 10 and its peripheral portion in the DRAM of FIG. 2. As shown in FIG. 3, in the memory cell array 10 of the first embodiment, the bit lines BL are hierarchized using the local bit line LBL and the global bit lines GBL. In the memory cell array 10 of FIG. 3, for example, assuming that M global bit lines GBL are arranged with a predetermined pitch, M/2 global sense amplifiers GSA are arranged on each of left and right sides of the memory cell array 10, and each of the global sense amplifiers GSA can be selectively connected to adjacent two global bit lines GBL. Further, N local bit lines LBL segmented along an extending direction of each global bit line GBL are arranged in the same direction corresponding to the hierarchical bit line structure. That is, M×N local bit lines LBL in total are arranged in the memory cell array 10. Thus, each local bit line LBL can be sufficiently shorter than each global bit line GBL, and parasitic capacitance thereof can be small. The memory cells MC in the memory cell array 10 can be formed with a small cell size of, for example, 6F2 cell size or 4F2 cell size. In addition, when employing memory cells MC of 4F2 cell size, local bit lines LBL may have a structure embedded in a silicon substrate.

As shown in FIG. 3, each global bit line GBL is divided into left and right portions by a switch S10 (the first switch of the invention) and a switch S20 (the second switch of the invention) that are inserted at an approximately center position. The switch S10 is an NMOS type transistor switched in response to a control signal GSCE applied to its gate, and the switch S20 is an NMOS type transistor switched in response to a control signal GSCO applied to its gate. Here, assuming that M global bit lines GBL are arranged in a numerical order from 0 to M−1 from the upper end of FIG. 3, one switch S10 is inserted in an even-numbered global bit line GBL while the other switch S20 is inserted in an odd-numbered global bit line GBL. That is, even-numbered global bit lines GBL(LE) (the first global bit lines of the invention) and odd-numbered global bit line GBL(LO) (the third global bit lines of the invention) are alternately arranged in a left area of the memory cell array 10, and even-numbered global bit lines GBL(RE) (the second global bit lines of the invention) and odd-numbered global bit line GBL(RO) (the fourth global bit lines of the invention) are alternately arranged in a right area of the memory cell array 10, respectively, with a predetermined pitch. In the following, a configuration of a unit circuit disposed in an area including a pair of global bit lines GBL (LE) and GBL(RE) and a pair of global bit lines GBL(LO) and GBL(RO) will be mainly described.

Switches S11, S12, S21 and S22 are arranged between the global sense amplifier GSA and the global bit line GBL. The switches S11 and S21 on the left function together as the third switch of the invention, while the switches S12 and S22 on the right function together as the fourth switch of the invention. That is, the global sense amplifier GSA(L) on the left (the first sense amplifier of the invention) is selectively connected to two global bit lines GBL(LE) and GBL(LO) via the switches S11 and S21. Further, the global sense amplifier GSA(R) on the right (the second sense amplifier of the invention) is selectively connected to two global bit lines GBL(RE) and GBL(RO) via the switches S12 and S22. The switches S11, S12, S21 and S22 are NMOS type transistors switched in response to control signals GSLE, GSRE, GSLO and GSRO applied to respective gates thereof in this order.

Precharge transistors P1 and P2 are connected to the global bit line GBL. That is, one precharge transistor P1 (the first precharge circuit of the invention) precharges the even-numbered global bit line GBL(LE) on the left to a precharge voltage VGBP in response to a precharge control signal GBPE applied to its gate. Further, the other precharge transistor P2 (the second precharge circuit of the invention) precharges the odd-numbered global bit line GBL(RO) on the right to the precharge voltage VGBP in response to a precharge control signal GBPO applied to its gate.

One end of each local bit line LBL is connected to the local sense amplifier LSA. An output node of each local sense amplifier LSA is selectively connected to the global bit line GBL via switches S13, S14, S23 and S24. Here, the local bit line LBL is segmented into local bit lines LBL(LE) (the first local bit line of the invention), LBL(RE) (the second local bit line of the invention), LBL(LO) (the third local bit line of the invention) and LBL(RO) (the fourth local bit line of the invention) corresponding to the global bit lines GBL(LE), GBL(RE), GBL(LO) and GBL(RO). Then, the switch S13 (the fifth switch of the invention) controls a connection between the even-numbered global bit line GBL(LE) on the left and the local bit line LBL(LE) in response to a control signal LSLE applied to its gate. The switch S14 (the sixth switch of the invention) controls a connection between the even-numbered global bit line GBL(RE) on the right and the local bit line LBL(RE) in response to a control signal LSRE applied to its gate. The switch S23 (the seventh switch of the invention) controls a connection between the odd-numbered global bit line GBL(LO) on the left and the local bit line LBL(LO) in response to a control signal LSLO applied to its gate. The switch S24 (the eighth switch of the invention) controls a connection between the odd-numbered global bit line GBL(RO) on the right and the local bit line LBL(RO) in response to a control signal LSRO applied to its gate.

As shown in FIG. 3, the memory cells MC described in FIG. 2 are arranged at intersections of the respective local bit lines LBL and the respective word lines WL. Thus, a signal voltage is read out from each memory cell MC to the local bit line LBL and is amplified by the local sense amplifier LSA, and the signal voltage is transmitted to the global bit line GBL via the switches S13, S14, S23 and S24. In addition, FIG. 3 shows only an i-th word line WLLi in the left area and an i-th word line WLRi in the right area, and shows the memory cells MC at intersections of these word lines WLLi and WLRi and the local bit line LBL. Further, although FIG. 3 shows only one local bit line LBL corresponding to each of the global bit lines GBL, in practice N/2 local bit lines LBL are arranged in, for example, an area of the global bit line GBL(LE) due to the segmentation, and this is the same in other areas.

As describe above, the local bit lines LBL and the global bit lines GBL have a single-ended structure in the first embodiment, and the local sense amplifiers LSA and the global sense amplifiers GSA have also the single-ended structure.

Figure 4:
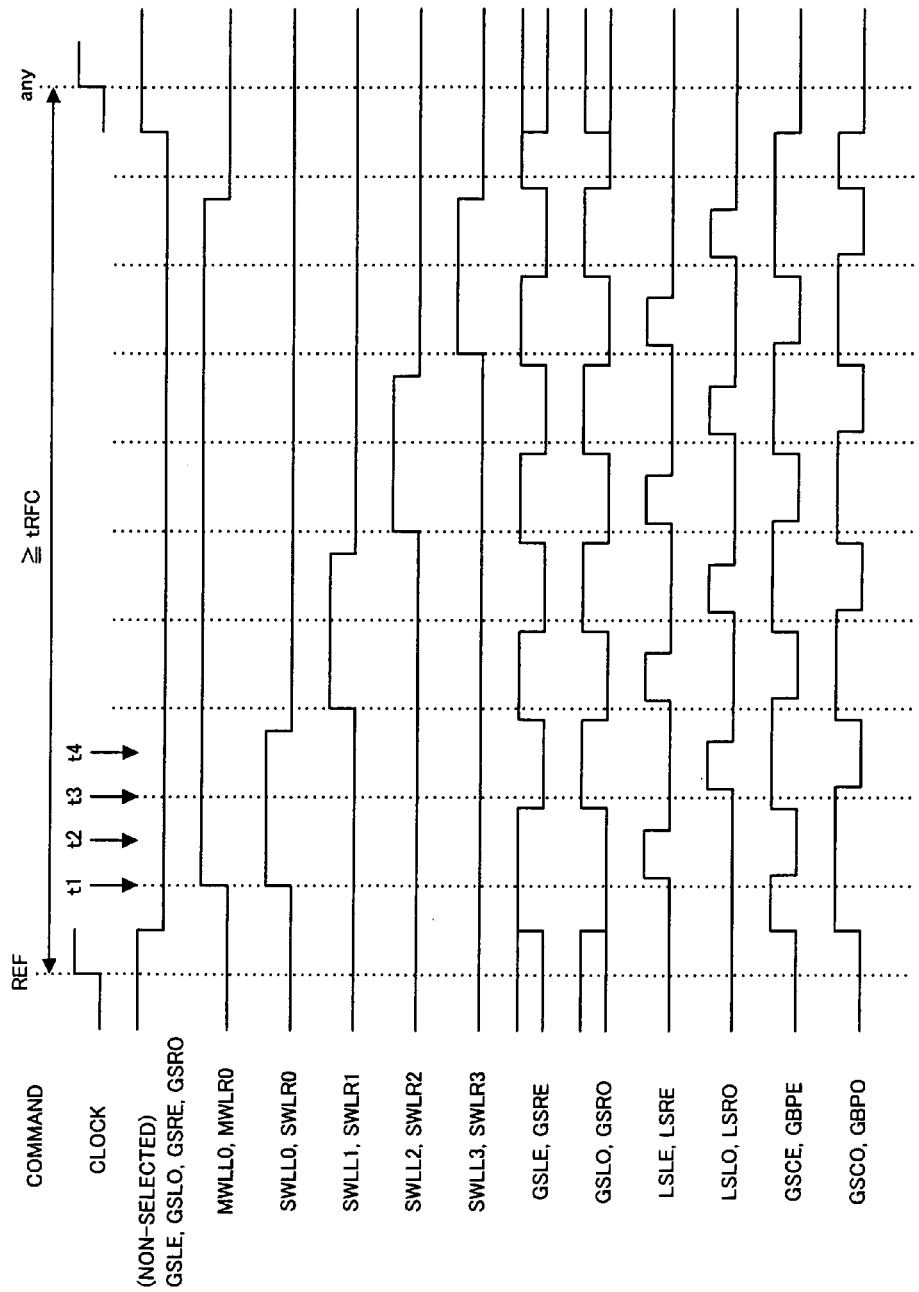
FIG. 4 is a diagram showing operation waveforms of respective parts of the memory cell array in a refresh mode in the first embodiment.

Next, an operation in a refresh mode of the memory cell array 10 of the first embodiment will be described with reference to FIGS. 4 to 8. FIG. 4 shows operation waveforms of respective parts of the memory cell array 10 in the refresh mode, and FIGS. 5 to 8 schematically shows connection relations of the memory cell array 10 corresponding to a plurality of timings t1, t2, t3 and t4 shown in FIG. 4. Here, as shown in the upper part of FIG. 4, an operation in a single refresh cycle period tRFC in case of responding an input refresh command will be described. Although it is assumed that word lines WL are hierarchized into main word lines MWL and sub-word lines SWL in FIG. 4 (see FIG. 9), two word lines WLLi and WLRi are represented in FIGS. 5 to 8 for simplicity according to FIG. 3.

Figure 5:
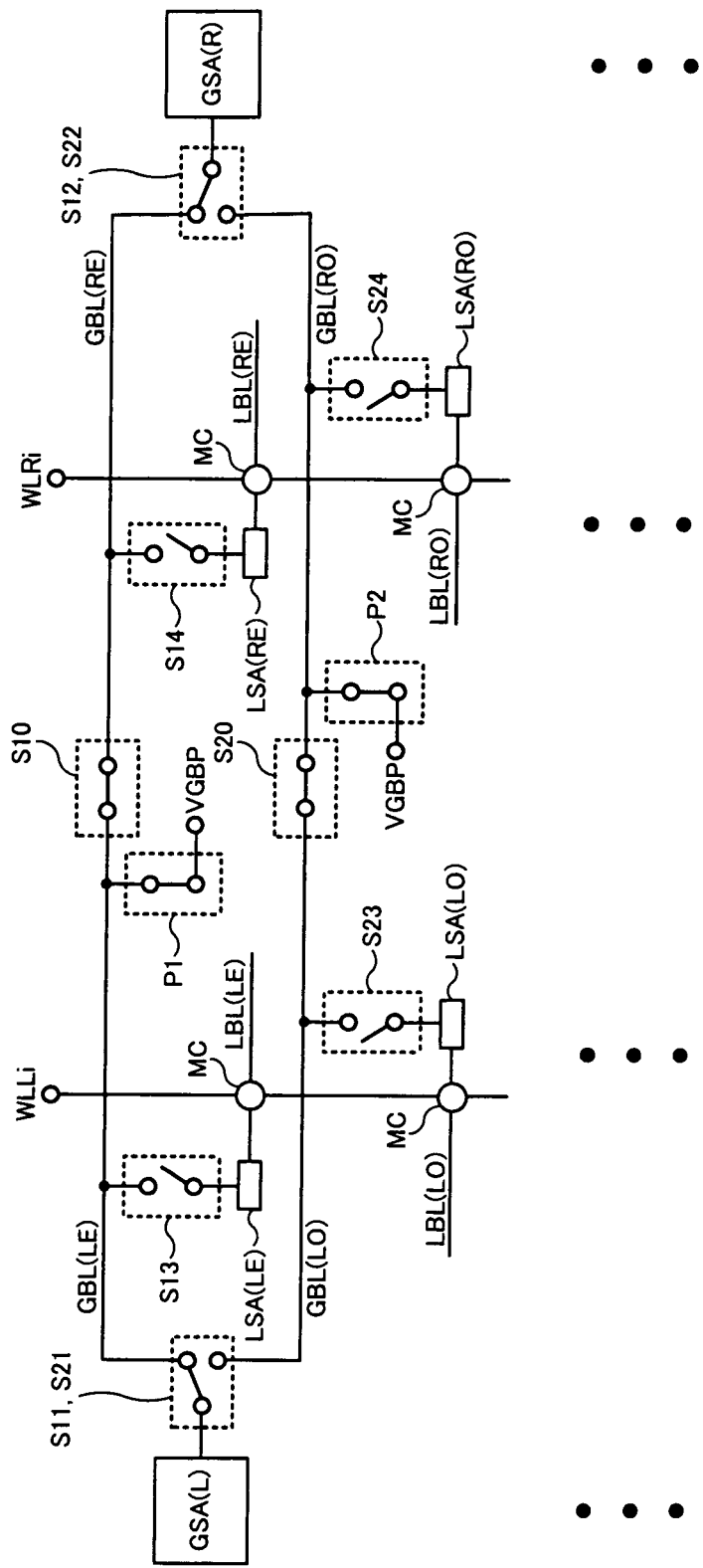
FIG. 5 is a diagram showing a connection relation set in the memory cell array in a first precharge period of FIG. 4.

In a first precharge period (immediately before the timing t1 of FIG. 4) after shifting to the refresh mode by the refresh command, a connection relation shown in FIG. 5 is set. At this point, the control signals GSLE and GSRE are set to a high level and the control signals GSLO and GSRO are set to a low level, respectively. Therefore, the even-numbered global bit lines GBL(LE) and GBL(RE) are connected to the global sense amplifiers GSA on both sides via the switches S11 and S12. Further, since the control signals GSCE, GSCO, GBPE and GBPO are set to a high level, all the global bit lines GBL are precharged to the precharge voltage VGBP.

Meanwhile, since the control signals LSLE, LSLO, LSRE and LSRO are set to a low level at the timing t1, each local bit line LBL is in a disconnected state from the global bit line GBL. At this point, each local bit line LBL is in a state of being precharged to the precharge voltage VGBP by a precharge circuit (not shown). Further, the word line WL is in a non-selected state (low level), and the memory cells MC disconnected from the local bit lines LBL are in a data retention state.

Figure 6:
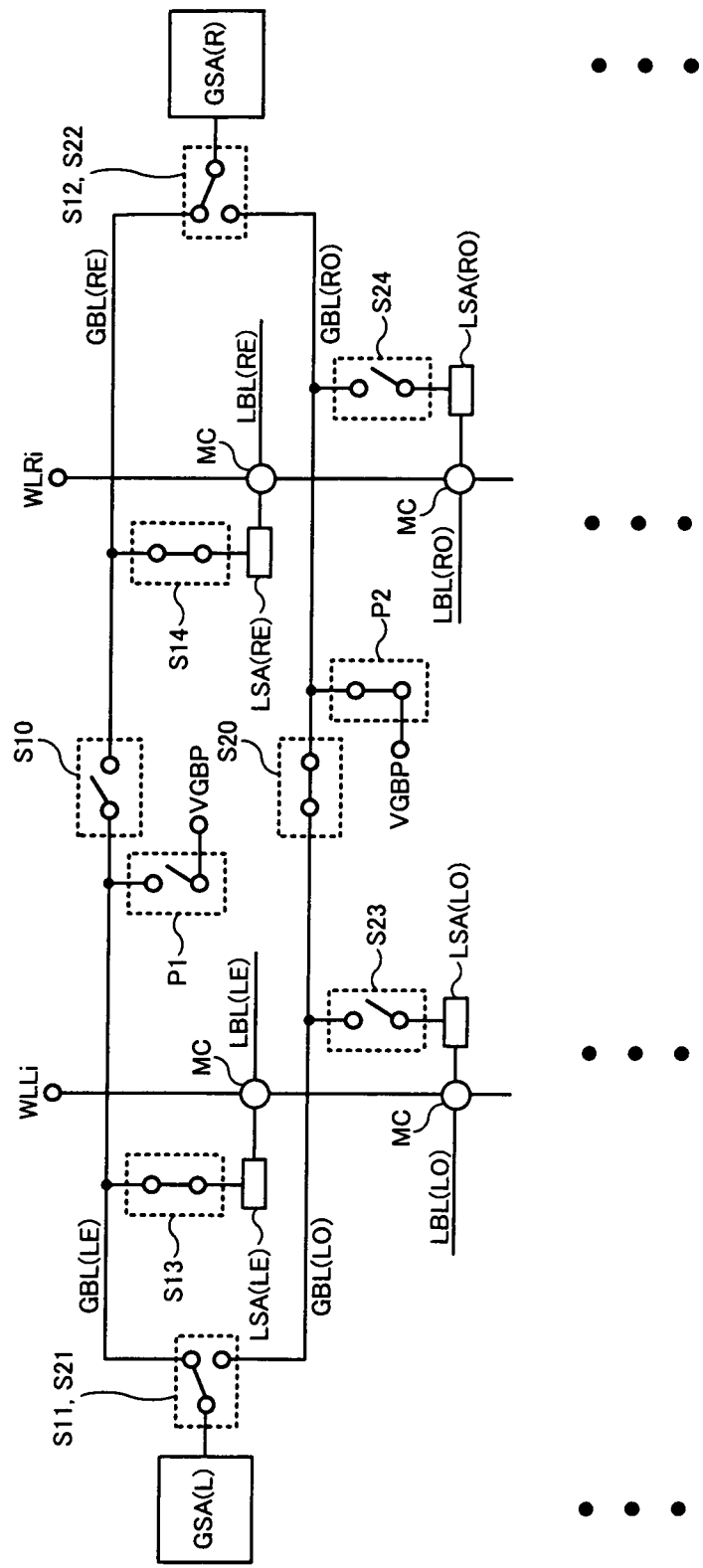
FIG. 6 is a diagram showing a connection relation set in the memory cell array in a first active period of FIG. 4.

Next, in a first active period (the first period of the invention: immediately before the timing t2 of FIG. 4) subsequent to the first precharge period, a connection relation shown in FIG. 6 is set. In the first active period, memory cells MC belonging to the local bit lines LBL corresponding to the even-numbered global bit lines GBL in the memory cell array 10 are refreshed. At this point, the control signals GBPE and GSCE are set to a low level, the even-numbered global bit lines GBL(LE) and GBL(RE) on the left and right are disconnected from each other by the switch S10, and thus the above precharging is finished. On the other hand, each of the odd-numbered global bit lines GBL(LO) and GBL(RO) is maintained at the precharge voltage VGBP, and thus functions as a shield between the adjacent even-numbered global bit lines GBL.

Further, word lines WLLi and WLRi on the left and right areas change to a selected state (high level) simultaneously, and signals are read from the memory cells MC to the local bit lines LBL and are transmitted to the local sense amplifier LSA. In addition, precharging of the local bit lines LBL is finished at this point. Subsequently, since the control signals LSLE and LSRE are set to a high level, the local sense amplifiers LSA(LE) and LSA(RE) on the left and right are connected to the global bit lines GBL(LE) and GBL(RE) via the switches S13 and S14. Thereby, the signals are amplified by the global sense amplifiers GSA on both sides, and thereafter the signals are restored to the corresponding memory cells MC again through the global bit lines GBL, the local sense amplifiers LSA and the local bit lines LBL.

Figure 7:
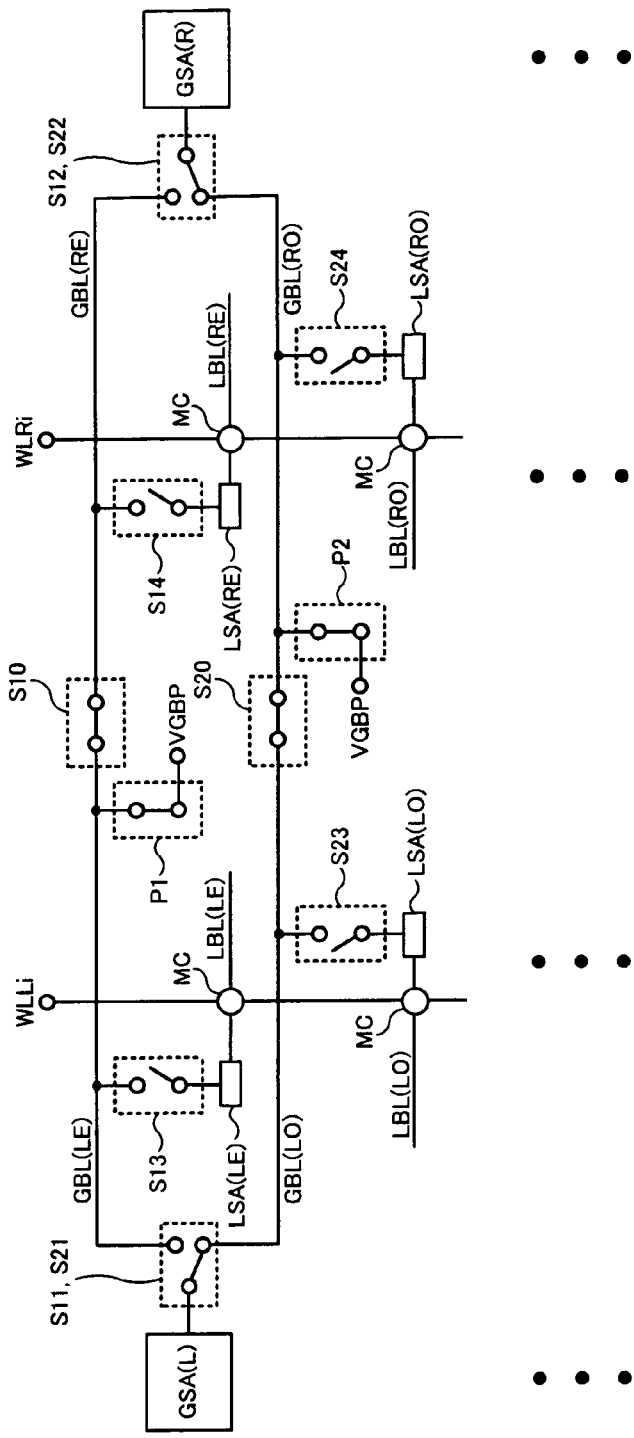
FIG. 7 is a diagram showing a connection relation set in the memory cell array in a second precharge period of FIG. 4.

Next, In a second precharge period (immediately before the timing t3 of FIG. 4) subsequent to the first active period, a connection relation shown in FIG. 7 is set. At this point, since the control signals LSLE and LSRE are set to a low level, the local sense amplifiers LSA(LE) and LSA(RE) on the left and right are disconnected from the global bit lines GBL(LE) and GBL(RE) by the switches S13 and S14, respectively.

Next, the control signals GSLE and GSRE are set to a low level and the control signals GSLO and GSRO are set to a high level, and thus the odd-numbered global bit lines GBL(LO) and GBL(RO) are connected to the global sense amplifiers GSA on both sides via the switches S21 and S22. Further, since the control signals GSCE and GBPE are set to a high level, all the global bit lines GBL are precharged to the precharge voltage VGBP again.

Figure 8:
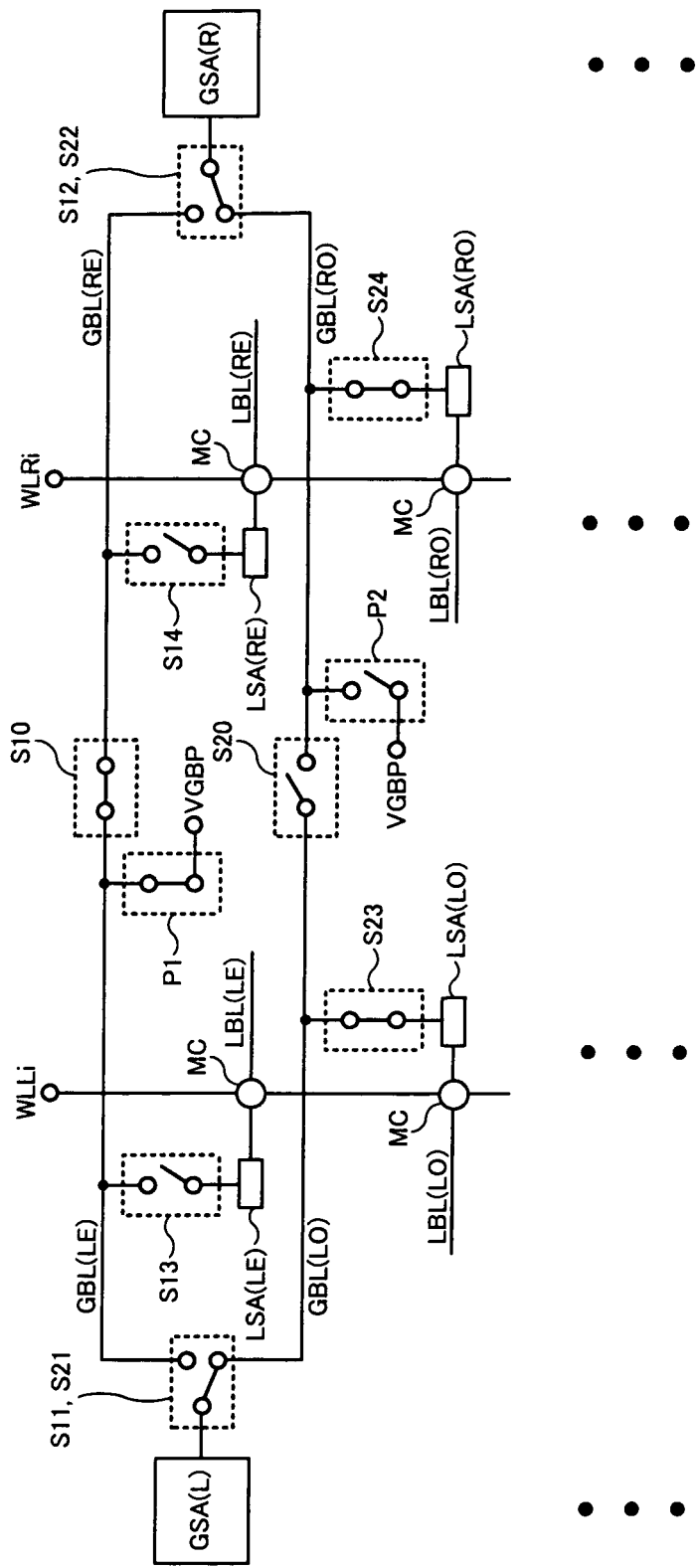
FIG. 8 is a diagram showing a connection relation set in the memory cell array in a second active period of FIG. 4.

Next, in a second active period (the second period of the invention: immediately before the timing t4 of FIG. 4) subsequent to the second precharge period, a connection relation shown in FIG. 8 is set. In the second active period, the memory cells MC belonging to the local bit lines LBL corresponding to the odd-numbered global bit lines GBL in the memory cell array 10 are refreshed. At this point, since the control signals GSCO and GBPO are set to a low level, the odd-numbered global bit lines GBL(LO) and GBL(RO) on the left and right are disconnected from each other by the switch S20, and the above precharging is finished. On the other hand, since the even-numbered global bit lines GBL(LE) and GBL(RE) maintain a state of being precharged to the precharge voltage VGBP, they have a function of shielding the adjacent odd-numbered global bit lines GBL.

Further, since the control signals LSLO and LSRO are set to a high level, the local sense amplifiers LSA(LO) and LSA(RO) on the left and right are connected to the global bit lines GBL(LO) and GBL(RO) via the switches S23 and S24. Thereby, read signals are amplified by the global sense amplifiers GSA on both sides, thereafter the signals are restored to corresponding memory cells MC again through the global bit lines GBL, the local sense amplifiers LSA and the local bit lines LBL, and a series of refresh operations finish.

Thereafter, as shown in FIG. 4, the refresh operation is continued by selecting next word lines WLLi+1 and WLRi+1 subsequent to the above word lines WLLi and WLRi. From this point, the series of refresh operations including the first precharge period, the first active period, the second precharge period and the second active period that are described in FIGS. 5 to 8 are repeated, details of which will be omitted. In addition, the example of FIG. 4 corresponds to a case where the refresh operation (FIGS. 5 to 8) as a unit is performed four times consecutively within the refresh cycle period tRFC, and therefore four operation waveforms of the same pattern repeatedly appear in FIG. 4.

As described above, by performing the refresh operation of FIGS. 4 to 8 in the semiconductor device of the first embodiment, refresh operations through the adjacent odd-numbered and even-numbered global bit lines GBL are performed at different times. Additionally, the above-mentioned shielding effect can be obtained, and therefore the coupling noise is reliably suppressed so that sensing margin of the global sense amplifiers GSA can be improved. Further, the refresh operation can be performed in a state where each global bit line GBL is divided by the switches S10 and S20 located at an approximate center of the memory cell array 10, and therefore a capacitance of each global bit line GBL can be substantially reduced to half. Accordingly, it is possible to reduce consumption current required in the refresh operation.

Figure 9:
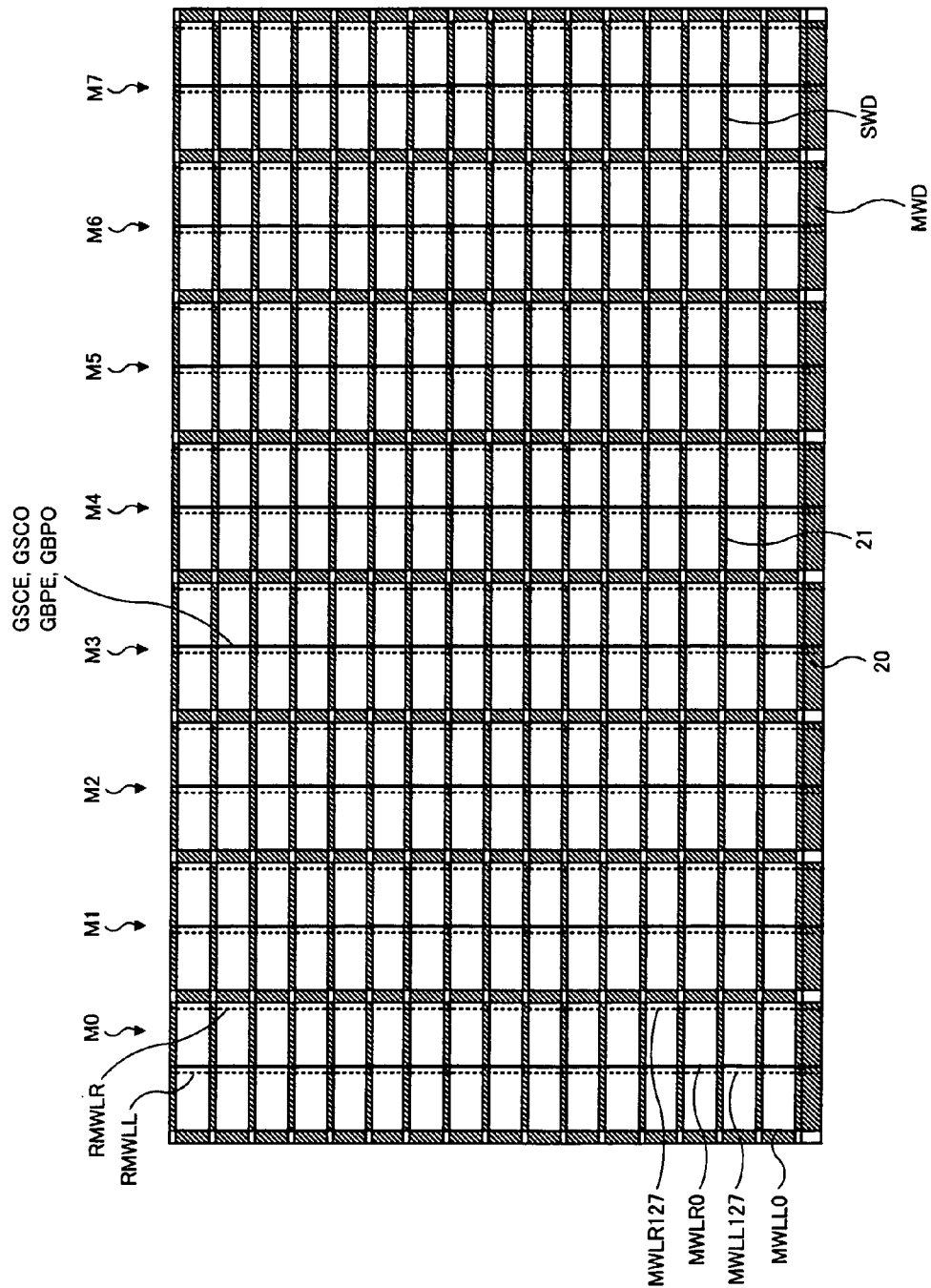
FIG. 9 is a block diagram showing a configuration example of the entire memory cell array of the first embodiment.
Figure 10:
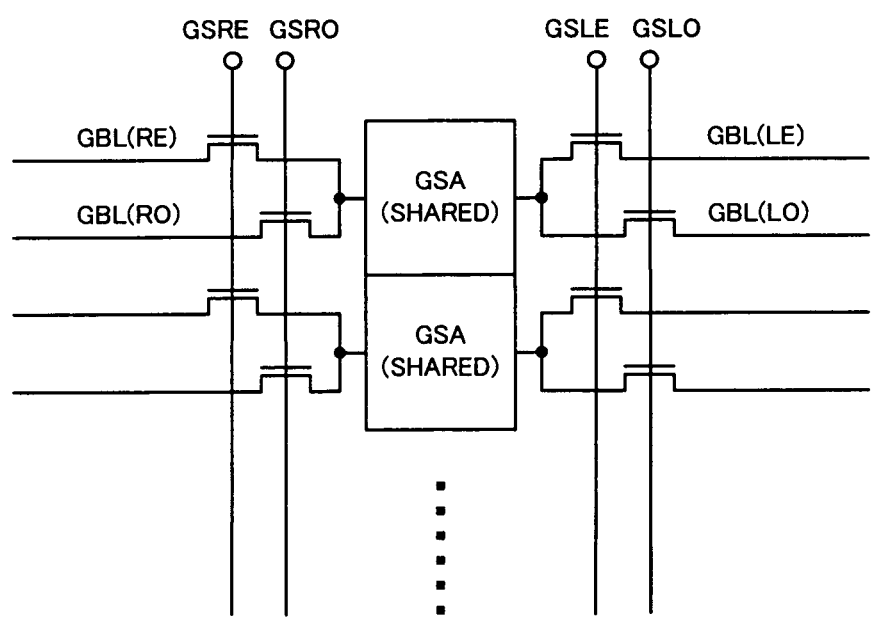
FIG. 10 is a block diagram showing a connection state of shared type global sense amplifiers in FIG. 9.

FIG. 9 is a block diagram showing a configuration example of the entire memory cell array 10 of the first embodiment. In the configuration example of FIG. 9, the memory cell array 10 includes eight memory mats M (M0 to M7) aligned in a bit line extending direction. The global sense amplifiers GSA on the left and right in FIG. 3 are arranged on both sides of each memory mat M. Each global sense amplifier GSA is shared by the global bit lines GBL included in the adjacent memory mats M on the left and right except global sense amplifiers GSA on the both sides in FIG. 9. Specifically, as shown in FIG. 10, the shared type global sense amplifier GSA has an input terminal on the right side that is selectively connected to two global bit lines GBL(LE) and GBL(LO) in the memory mat M on the right via the switches S11 and S22 (FIG. 3) controlled in response to the control signals GSLE and GSLO and has an input terminal on the left side that is selectively connected to two global bit line GBL(RE) and GBL(RO) in the memory mat M on the left via the switches S12 and S22 (FIG. 3) controlled in response to the control signals GSRE and GSRO.

Further, as described above, the word lines WL are hierarchized into the main word lines MWL and the sub-word lines SWL. One main word line MWL is selected by a main word decoder MWD, and one of eight sub-word lines SWL corresponding to the main word line MWL is selectively driven by a sub-word decoder SWD. Here, the number of memory mats M included in the memory cell array 10 and the hierarchical structure of the word lines WL can be properly modified without being restricted to the configuration example of FIG. 9.

Each memory mat M is divided into left and right areas by the switches S10 and S20 shown in FIG. 3 located at a boundary. As shown in FIG. 9, 128 main word lines MWLL0 to MWLL127 and one redundant main word line RMWLL are arranged in the left area in the memory mat M, and 128 main word lines MWLR0 to MWLR127 and one redundant main word line RMWLR are arranged in the right area in the memory mat M. When operating the memory cell array 10 of FIG. 9 in the refresh mode, two main word lines MWL (or redundant main word lines RMWL) located at the same address in the left and right areas are simultaneously selected. In this case, 2048 sub-word lines SWL and 16 redundant sub-word lines are arranged respectively in total in the left and right areas of each memory mat M.

Figure 11:
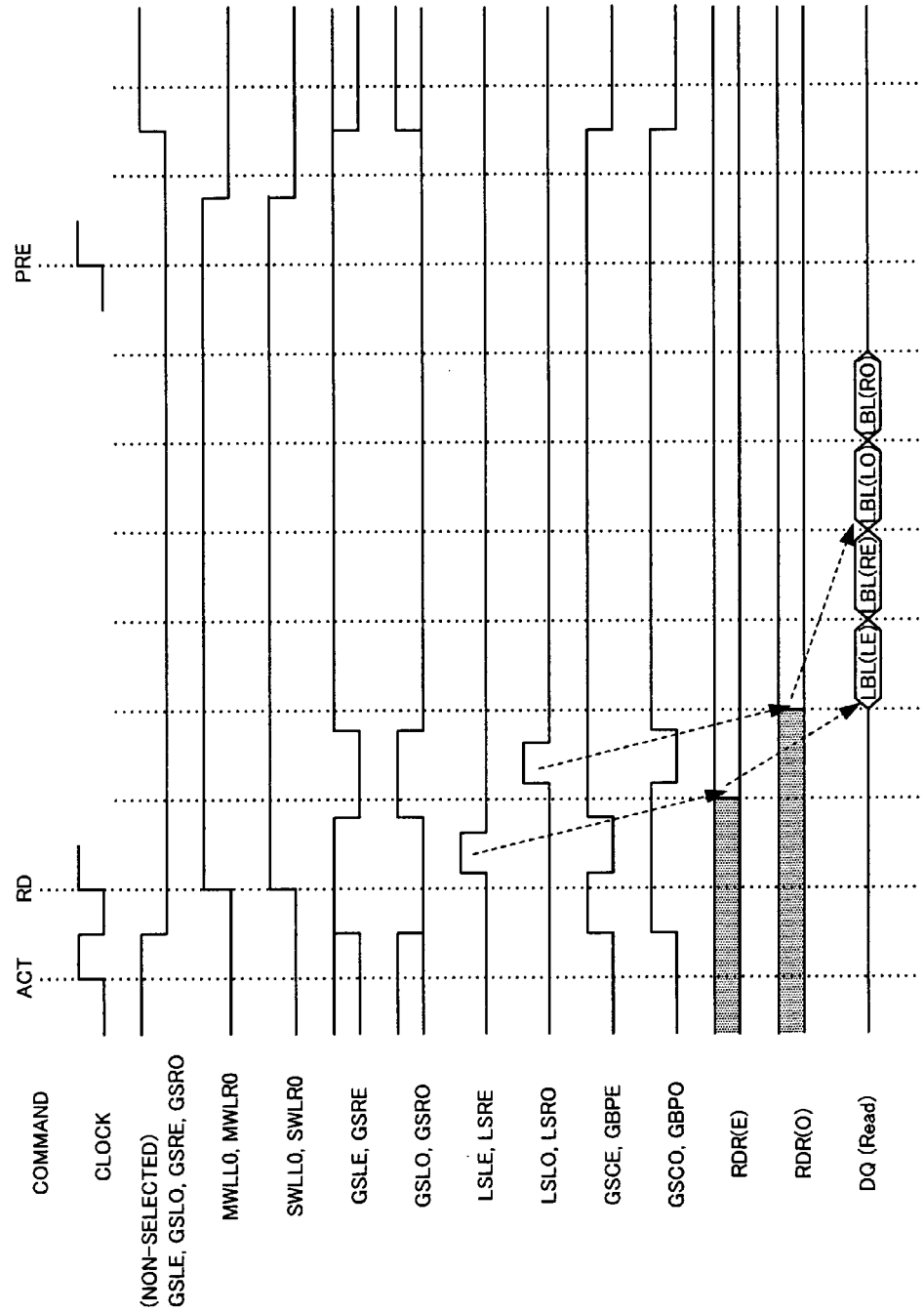
FIG. 11 is a diagram showing operation waveforms of respective parts of the memory cell array in a read operation in the first embodiment.
Figure 12:
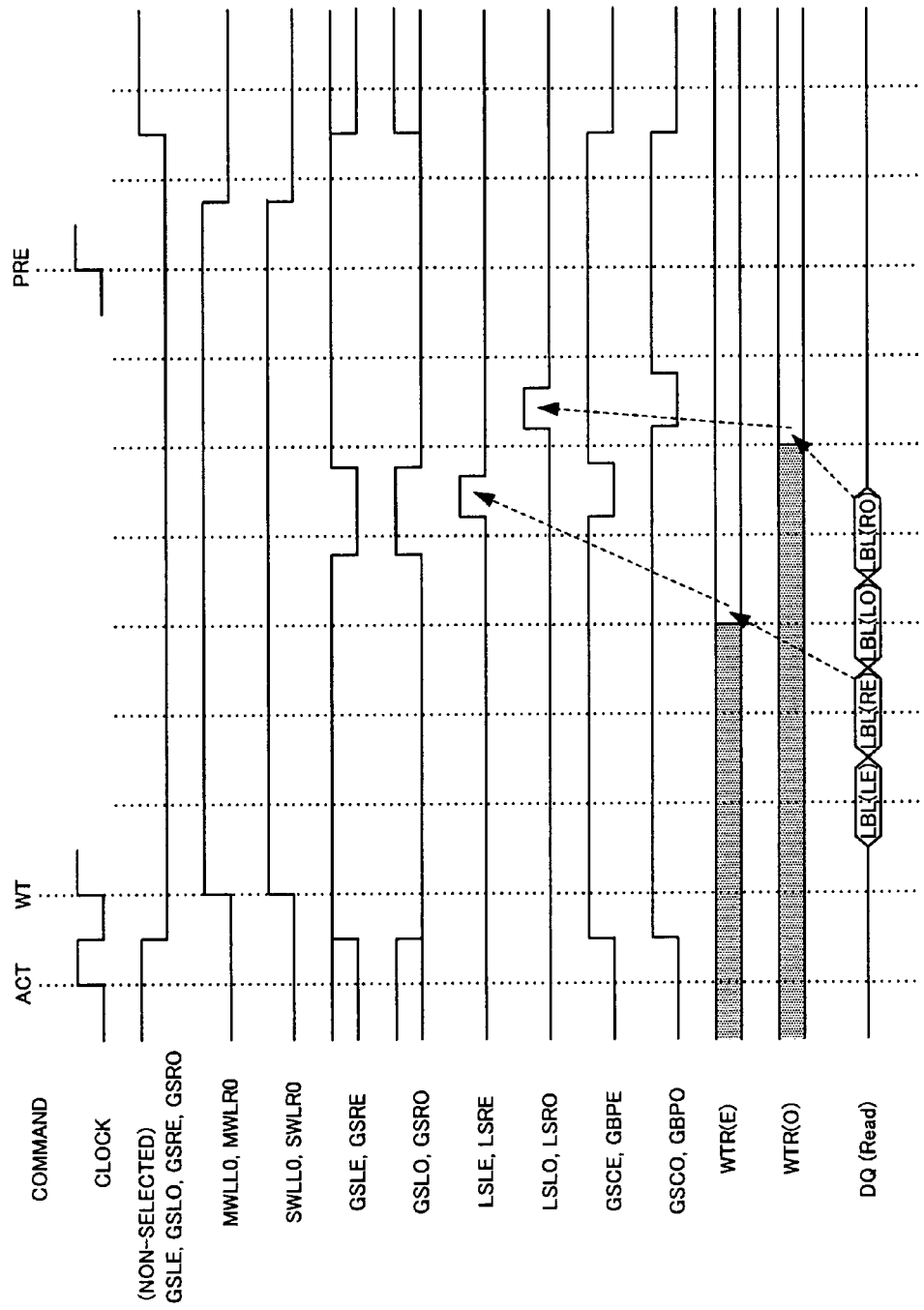
FIG. 12 is a diagram showing operation waveforms of respective parts of the memory cell array in a write operation in the first embodiment.

Next, the read operation and the write operation each as the normal operation of the memory cell array 10 of the first embodiment will be described with reference to FIGS. 11 and 12. FIG. 11 shows operation waveforms of respective parts of the memory cell array 10 in the read operation, and FIG. 12 shows operation waveforms of respective parts of the memory cell array 10 in the write operation, in which most of the respective control signals correspond to the notation in FIG. 4.

In the read operation, an active command ACT is inputted first, and a read command RD is inputted at a next clock, as shown in FIG. 11. Here, there are provided a read register RDR(E) corresponding to the even number and a read register RDR(O) corresponding to the odd number each as a read register RDR (not shown in FIG. 3) that stores data read out through the local bit line LBL and the global bit line GBL in the read operation.

After the read command RD is inputted, a signal read out to the even-numbered local bit line LBL is transmitted through a path including the local sense amplifier LSA, the global bit line GBL and the global sense amplifier GSA (see FIG. 5) in accordance with the control of the control signals GSLE, GSRE, LSLE and LSRE, and data thereof is stored in the read register RDR(E) for the even number. Subsequently, a signal read out to the odd-numbered local bit line LBL is transmitted through a path including the local sense amplifier LSA, the global bit line GBL and the global sense amplifier GSA (see FIG. 7) in accordance with the control of the control signals GSLO, GSRO, LSLO and LSRO, and data thereof is stored in the read register RDR(0) for the odd number. In this case, two read operations each for one bit are performed for each of a pair of the read registers RDR(E) and RDR(0) corresponding to the global sense amplifiers GSA on both sides, and therefore data of 4 bits in total are stored therein.

Next, at a timing coinciding with a read latency 2, burst output from DQ pins is started for the data stored in the read registers RDR(E) and RDR(O), and pieces of read data from the local bit lines LBL(LE), LBL(RE), LBL(LO) and LBL(RO) are sequentially outputted in this order. Thereafter, when the precharge command PRE is inputted, the selected word line WL is deactivated and precharging of the local bit line LBL and the global bit line GBL is started.

Meanwhile, in the write operation, the above command ACT is inputted first, and a write command WT is inputted at a next clock, as shown in FIG. 12. Here, there are provided a write register WTR(E) corresponding to the even number and a write register WTR(O) corresponding to the odd number each as a write register WTR (not shown in FIG. 3) that stores data written through the local bit line LBL and the global bit line GBL in the write operation.

After the write command WT is inputted, burst input from the DQ pins is started for write data to be written into the write register WTR at a timing coinciding with a write latency 1, and pieces of write data for the local bit lines LBL(LE), LBL(RE), LBL(LO) and LBL(RO) are sequentially inputted in this order. At this point, the local bit line LBL and the global bit line GBL are maintained in a precharged state.

Next, data of 2 bits corresponding to the local bit lines LBL(LE) and LBL(RE) is stored in the write register WTR (E). Then, the data of 2 bits in the write register WTR(E) is written into the memory cells MC through the even-numbered global bit line GLB and the local bit line LBL in accordance with the control of the control signals GSLE, GSRE, LSLE and LSRE. Meanwhile, data of 2 bits corresponding to the local bit lines LBL(LO) and LBL(RO) is stored in the write register WTR(O). Then, the data of 2 bits in the write register WTR(O) is written into the memory cells MC through the odd-numbered global bit line GLB and the local bit line LBL in accordance with the control of the control signals GSLO, GSRO, LSLO and LSRO. Thereafter, when a precharge command PRE is inputted, the selected word line WL is deactivated and precharging of the local bit line LBL and the global bit line GBL is started.

Also, when performing the read operation of FIG. 11 and the write operation of FIG. 12 in the first embodiment, it is possible to improve the sensing margin by suppressing the coupling noise between the adjacent global bit lines and to reduce operation current by reducing the capacitance of each global bit line GBL, similarly as in the above described refresh operation.

Second Embodiment

Figure 13:
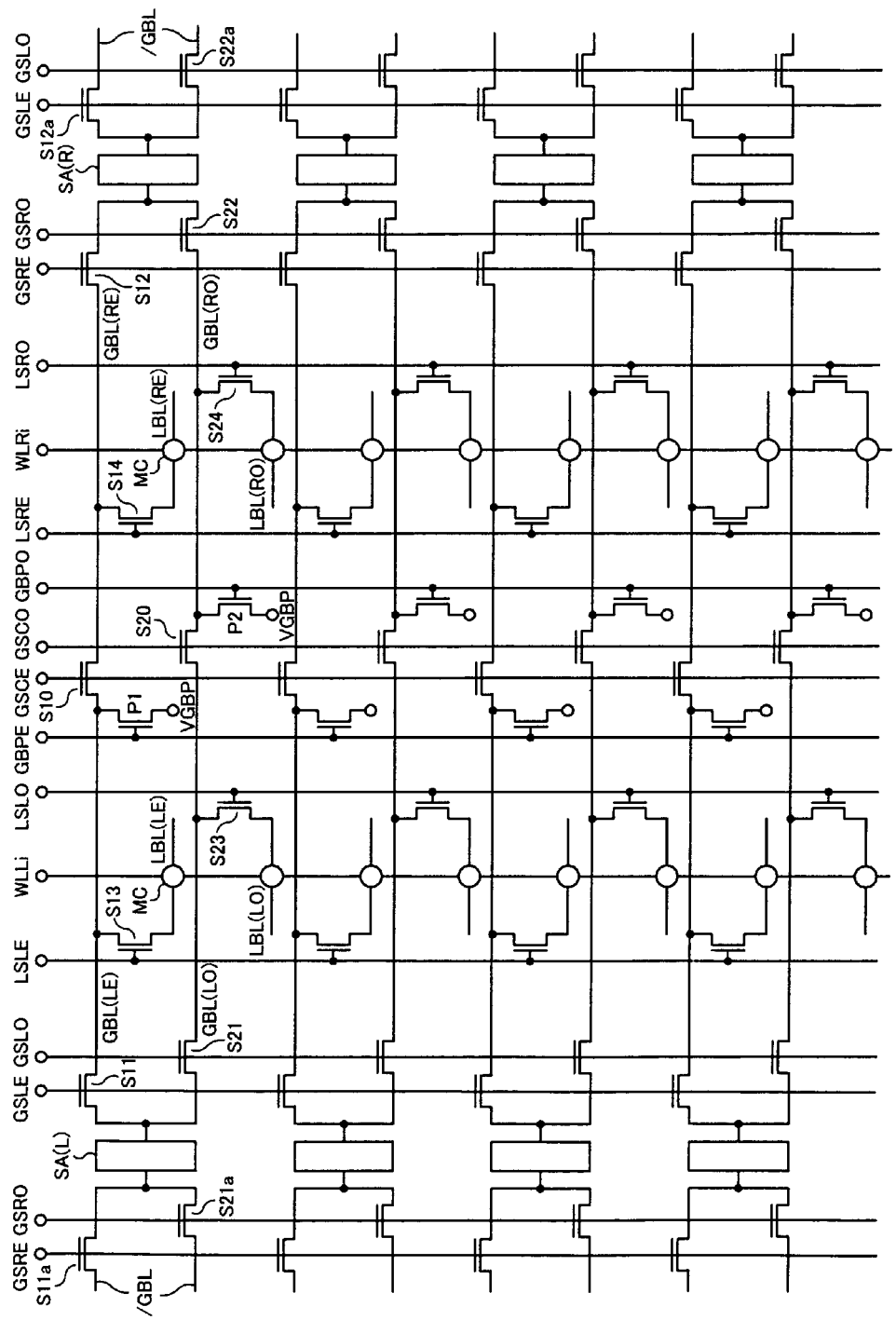
FIG. 13 is a diagram showing a configuration of a memory cell array and its peripheral portion in a DRAM of a second embodiment.

Next, a DRAM of a second embodiment to which the invention is applied will be described. The entire configuration of the DRAM of FIG. 2 is common in the second embodiment, so description thereof will be omitted. FIG. 13 is a diagram showing a configuration of the memory cell array 10 and its peripheral portion in the DRAM of the second embodiment, which shows a range corresponding to FIG. 3. As shown in FIG. 13, although the memory cell array 10 of the second embodiment employs the hierarchical bit line structure in the same manner as the first embodiment, it is different from the first embodiment that an open bit line structure is employed and sense amplifiers are not hierarchized in the second embodiment.

In FIG. 13, the arrangement of the global bit lines GBL and the local bit lines LBL, and the connection relations of the switches S10 to S12, S20 to S22 and the precharge transistors P1, P2 are the same as those in FIG. 3. Meanwhile, in FIG. 13, it is different from FIG. 3 that the local sense amplifiers LSA are not provided and that each of the switches S13, S14, S23 and S24 is directly connected to one end of the local bit line LBL. In addition, the switches S11, S12, S21 and S22 are NMOS type transistors switched in response to the control signals GSLE, GSRE, GSLO and GSRO applied to gates thereof in this order, which are the same as in FIG. 3.

Further, since the open bit line structure is employed in the second embodiment, differential type sense amplifiers SA are arranged instead of the global sense amplifiers GSA of FIG. 3. Each sense amplifier SA has one terminal selectively connected to two global bit lines GBL via the switches S11, S21, S12 and S22 and the other terminal selectively connected to two complementary global bit lines/GBL via the switches S11a, S21a, S12a and S22a, in which sensing operation of the sense amplifier SA and the refresh operation are performed in a state where the one global bit line GBL and the one complementary global bit line/GBL that are opposite to each other via the sense amplifier SA are connected to each other. In addition, switches S11a and S21a connected to a sense amplifier SA(L) on the left and switches S12a and S22a connected to a sense amplifier SA(R) on the right are NMOS type transistors switched in response to the control signals GSRE, GSRO, GSLE and GSLO applied to gates thereof in this order.

Next, an operation in the refresh mode of the memory cell array 10 of the second embodiment will be described with reference to FIGS. 14 to 17. FIGS. 14 to 17 schematically show connection relations of the memory cell array 10 of the second embodiment corresponding to the plurality of timings t1, t2, t3 and t4 of FIG. 4 in the refresh operation. Most of basic operations in FIGS. 14 to 17 are common to those in FIGS. 5 to 8 of the first embodiment, and thus different points will be mainly described below. In addition, the word lines WLLi and WLRi in FIGS. 14 to 17 are represented in the same manner as in FIGS. 5 to 8.

Figure 14:
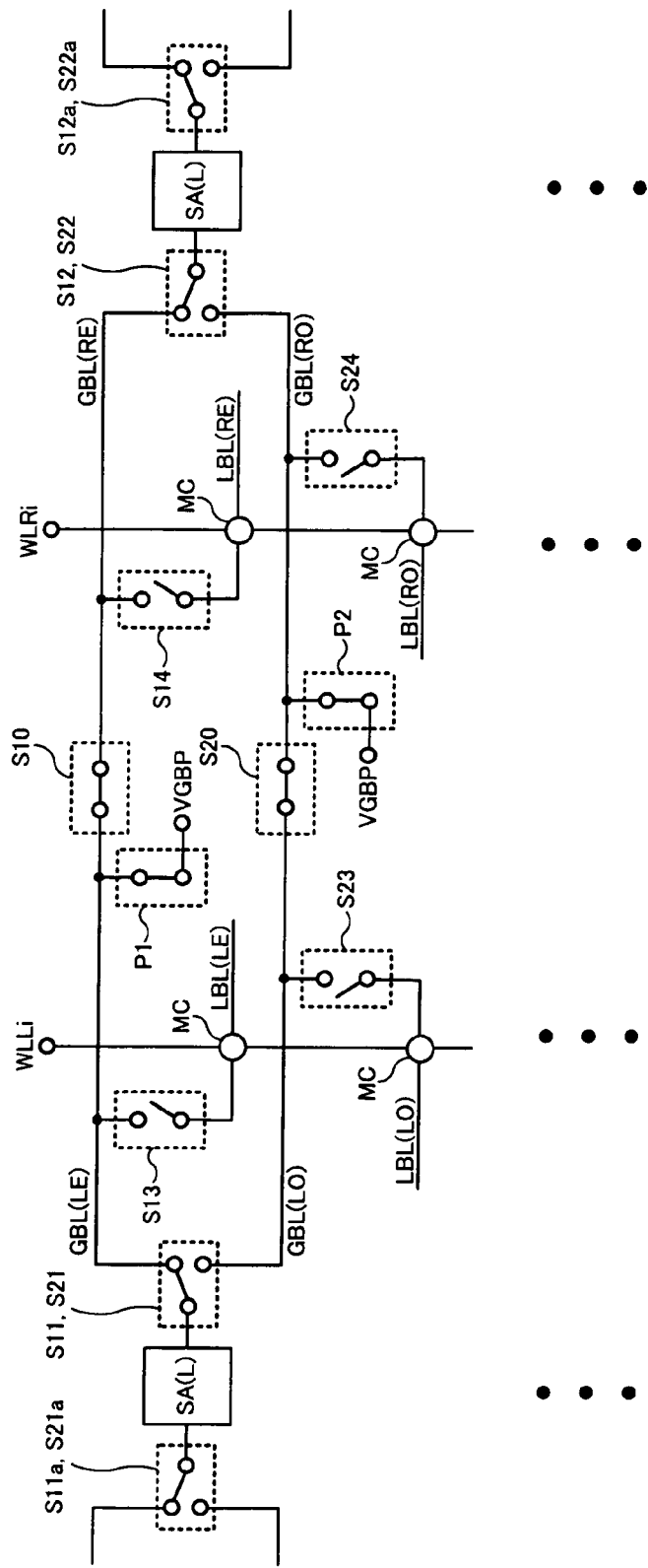
FIG. 14 is a diagram showing a connection relation set in the memory cell array in the first precharge period in the second embodiment.

In the first precharge period (immediately before the timing t1 of FIG. 4) after shifting to the refresh mode by the refresh command, a connection relation shown in FIG. 14 is set. Respective control signals at this point are controlled almost in the same manner as in FIG. 5. Then, the even-numbered global bit lines GBL(LE) and GBL(RE) are connected to the sense amplifiers SA on both sides via the switches S11 and S12, and corresponding complementary global bit lines/GBL are also connected thereto via the switches S11a and S12a. At this point, all the global bit lines GBL are in a state of being precharged to the precharge voltage VGBP. On the other hand, similarly as in FIG. 5, each local bit line LBL that is in a state of being precharged to the precharge voltage VGBP is in a disconnected state from the global bit line GBL, and non-selected memory cells MC are in a data retention state.

Figure 15:
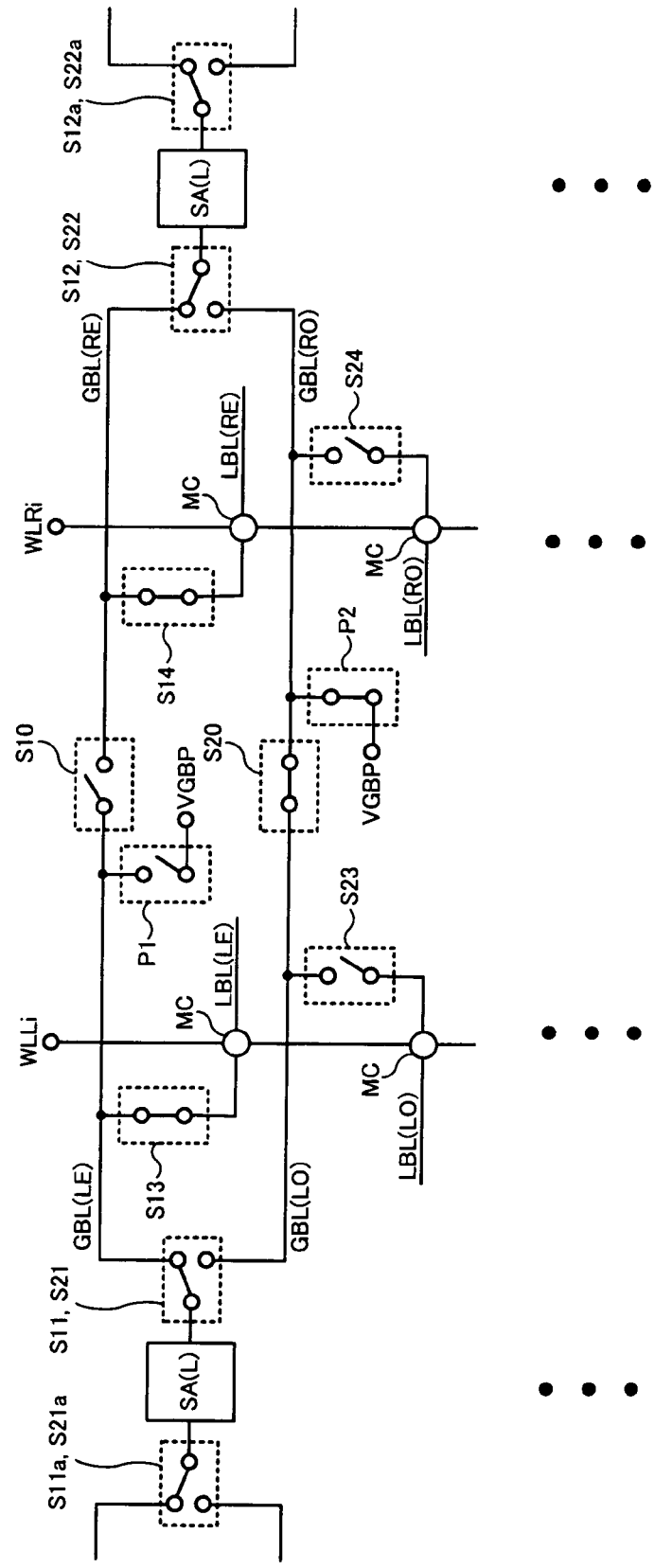
FIG. 15 is a diagram showing a connection relation set in the memory cell array in the first active period in the second embodiment.

Next, in the first active period (immediately before the timing t2 of FIG. 4) subsequent to the first precharge period, a connection relation shown in FIG. 15 is set. Respective control signals at this point are controlled almost in the same manner as in FIG. 6, and the memory cells MC belonging to the local bit lines LBL corresponding to the even-numbered global bit lines GBL in the memory cell array 10 are refreshed. On the other hand, each of the odd-numbered global bit lines GBL being maintained at the precharge voltage VGBP functions as a shield between the adjacent even-numbered global bit lines GBL, similarly as in FIG. 6. Further, the signal amplified by the sense amplifier SA is restored to the memory cell MC through the same path as in FIG. 6.

Figure 16:
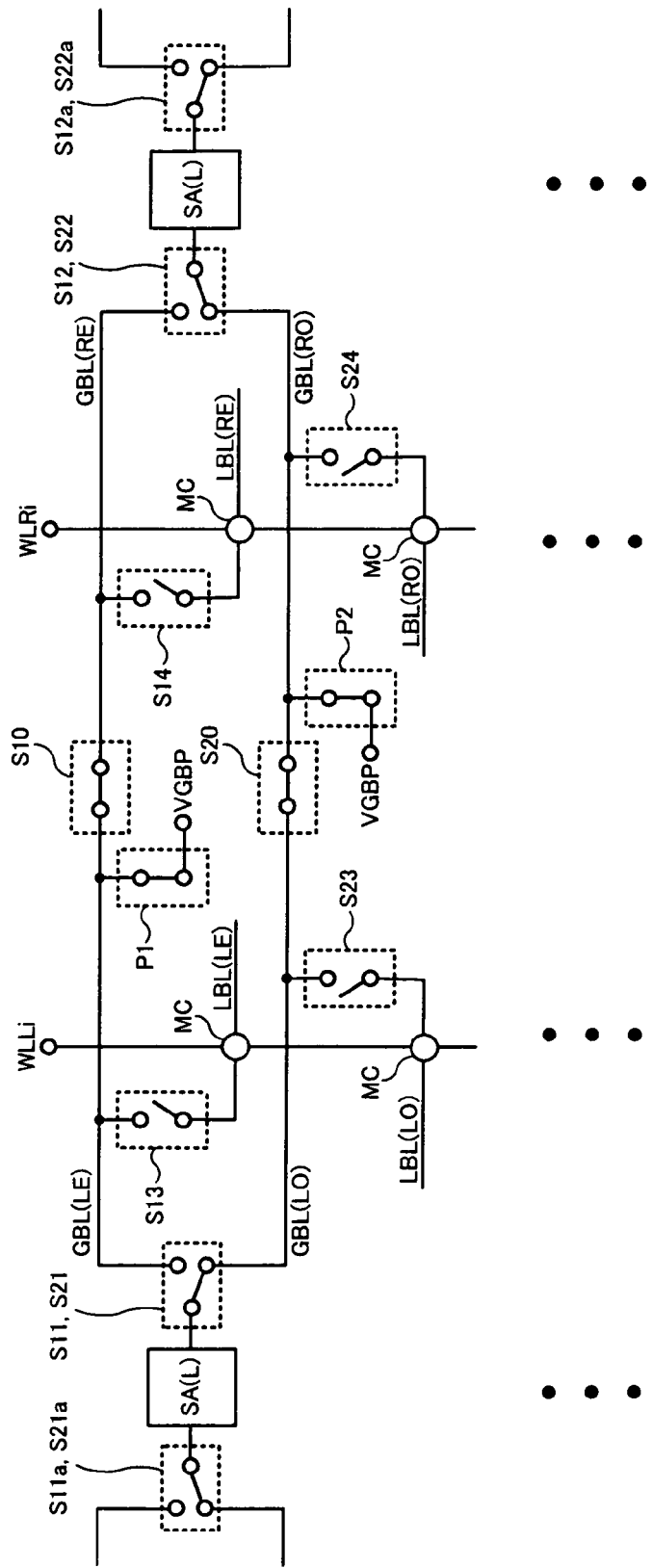
FIG. 16 is a diagram showing a connection relation set in the memory cell array in the second precharge period in the second embodiment.

Next, in the second precharge period (immediately before the timing t3 of FIG. 4) subsequent to the first active period, a connection relation shown in FIG. 16 is set. Respective control signals at this point are controlled almost in the same manner as in FIG. 7. Then, the odd-numbered global bit lines GBL(LO) and GBL(RO) are connected to the sense amplifiers SA on both sides via the switches S21 and S22, and corresponding complementary global bit lines/GBL are also connected thereto via the switches S21a and S22a. At this point, all the global bit lines GBL are in a state of being precharged to the precharge voltage VGBP. On the other hand, the even-numbered local bit lines LBL(LE) and LBL(RE) are maintaining signals amplified by the sense amplifiers SA in the first active period, and the odd-numbered local bit lines LBL(LO) and LBL(RO) are maintaining signals being read out from the memory cells MC selected in the first active period and are in a disconnected state from the global bit line GBL, and non-selected memory cells MC are in a data retention state.

Figure 17:
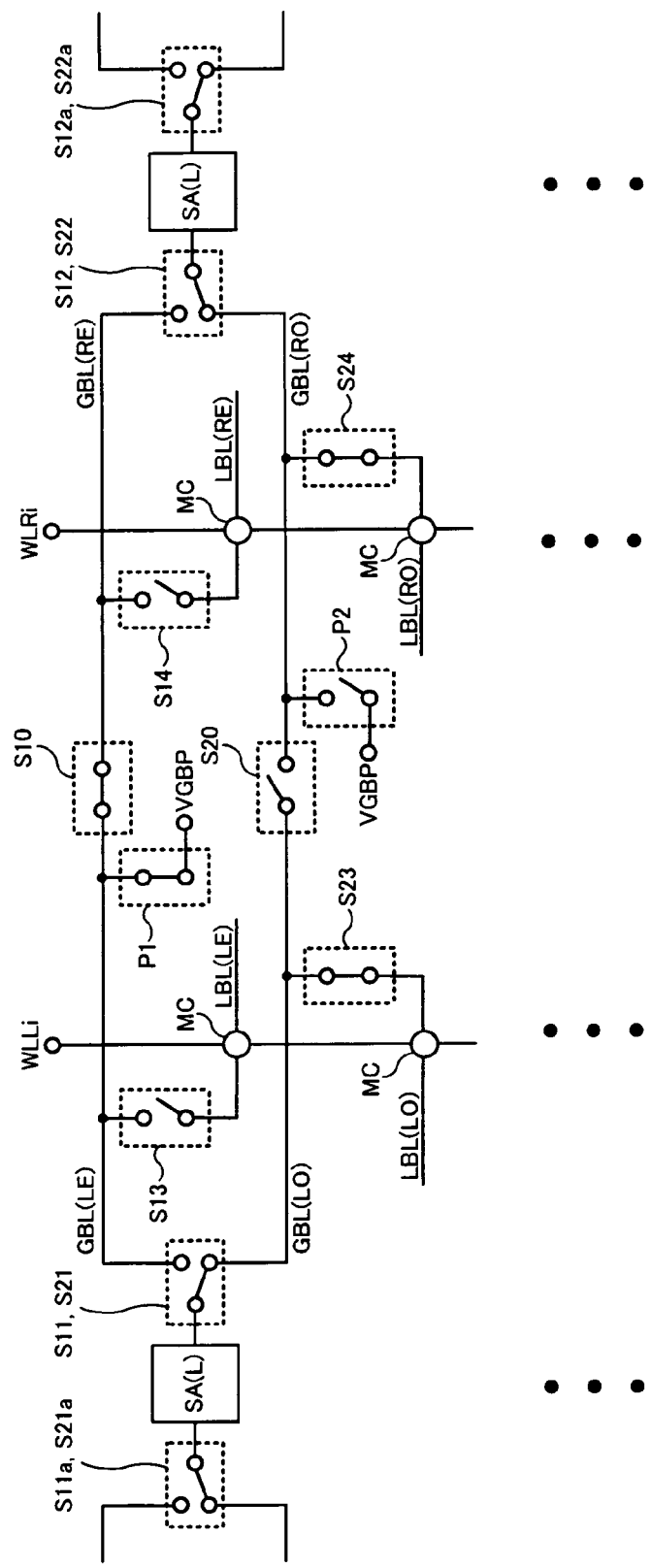
FIG. 17 is a diagram showing a connection relation set in the memory cell array in the second active period in the second embodiment.

Next, in the second active period (immediately before the timing t4 of FIG. 4) subsequent to the second precharge period, a connection relation shown in FIG. 17 is set. Respective control signals at this point are controlled almost in the same manner as in FIG. 8, and the memory cells MC belonging to the local bit lines LBL corresponding to the odd-numbered global bit lines GBL in the memory cell array 10 are refreshed. On the other hand, each of the even-numbered global bit lines GBL being maintained at the precharge voltage VGBP functions as a shield between the adjacent odd-numbered global bit lines GBL, similarly as in FIG. 8. Further, the signal amplified by the sense amplifier SA is restored to the memory cell MC through the same path as in FIG. 8, and a series of refresh operations finish.

As described above, in the second embodiment, it is possible to achieve basic effects of improving the sensing margin by suppressing the coupling noise between the adjacent global bit lines and of reducing the operation current by reducing the capacitance of each global bit line GBL, similarly as in the first embodiment.

In the foregoing, the preferred embodiments of the present invention have been described. However the present invention is not limited to the above embodiments and can variously be modified without departing the essentials of the present invention. For example, circuit portions included in the memory cell array 10 are not limited to the configurations shown in the embodiments and various circuit configurations can be employed for the memory cell array 10. Also, various circuit configurations can be employed for the peripheral circuits of the memory cell array 10 (see FIG. 2) without being limited to the configurations shown in the embodiments.

The present invention is not limited to the DRAM disclosed in the embodiments, and can be applied to various semiconductor devices such as CPU (Central Processing Unit), MCU (Micro Control Unit), DSP (Digital Signal Processor), ASIC (Application Specific Integrated Circuit), ASSP (Application Specific Standard Product) and the like. Further, the present invention can be applied to various devices such as SOC (System on Chip), MCP (Multi Chip Package) and POP (Package on Package) and the like.

Further, transistors of the present invention are field-effect transistors (FETs) including various transistors such as not only MOS (Metal Oxide Semiconductor) transistors but also MIS (Metal-Insulator Semiconductor) transistors, TFT (Thin Film Transistor) and the like. Further, the device of the invention may include bipolar transistors. Furthermore, an N-channel type transistor (NMOS transistors) is a typical example of a first conductive type transistor, and a P-channel type transistor (PMOS transistor) is a typical example of a second conductive type transistor.

The present invention can be applied to devices based on various combinations or selections of the disclosure of the embodiments. That is, the present invention covers various modifications which those skilled in the art can carry out in accordance with all disclosures including claims and technical ideas.

The invention claimed is:

1. A semiconductor device comprising a memory cell array configured with hierarchical local bit lines and global bit lines, the device comprising:
    first to fourth local bit lines respectively transmitting first to fourth signals corresponding to first to forth memory cells that are selected simultaneously;
    first to fourth global bit lines respectively corresponding to the first to fourth local bit lines;
    a first switch controlling a connection between one end of the first global bit line and one end of the second global bit line;
    a second switch controlling a connection between one end of the third global bit line and one end of the fourth global bit line;
    first and second sense amplifiers;
    a third switch selectively connecting one of the other ends of the first and third global bit lines to the first sense amplifier;
    a fourth switch selectively connecting one of the other ends of the second and fourth global bit lines to the second sense amplifier;
    fifth to eighth switches connecting between the first to fourth local bit lines and the first to fourth global bit lines respectively; and
    a control circuit controlling the first to eighth switches,
    wherein the first and third global bit lines are physically adjacent to each other and the second and fourth global bit lines are physically adjacent to each other,
    in a first period, the control circuit performs a first operation in which the first sense amplifier amplifies the first signal and a second operation in which the second sense amplifier amplifies the second signal, the first and second operations being performed in a state where the first and second global bit lines are electrically disconnected from each other by the first switch, the third and fourth global bit lines are electrically connected to each other via the second switch, the fifth and sixth switches become conductive, the seventh and eighth switches become non-conductive, the third and fourth global bit lines are set to a predetermined potential, the first global bit line is electrically connected to the first sense amplifier via the third switch, and the second global bit line is electrically connected to the second sense amplifier via the fourth switch, and in a second period different from the first period, the control circuit further performs a third operation in which the first sense amplifier amplifies the third signal and a fourth operation in which the second sense amplifier amplifies the fourth signal, the third and fourth operations being performed in a state where the first and second global bit lines are electrically connected to each other via the first switch, the third and fourth global bit lines are electrically disconnected from each other by the second switch, the seventh and eighth switches become conductive, the fifth and sixth switches become non-conductive, the first and second global bit lines are set to the predetermined potential, the third global bit line is electrically connected to the first sense amplifier via the third switch, and the fourth global bit line is electrically connected to the second sense amplifier via the fourth switch.

2. The semiconductor device according to claim 1 further comprising:
a first precharge circuit supplying a first precharge voltage as the predetermined potential to at least one of the first and second global bit lines, and
a second precharge circuit supplying the first precharge voltage to at least one of the third and fourth global bit lines,
wherein in a first precharge period prior to the first period, the first precharge circuit supplies the first precharge voltage to the first and second global bit lines via the first switch,
and in a second precharge period subsequent to the first period and prior to the second period, the second precharge circuit supplies the first precharge voltage to the third and fourth global bit lines via the second switch.

3. The semiconductor device according to claim 2, wherein the first and second global bit lines are arranged along a same line in a first direction, and the third and fourth global bit lines are arranged along a same line in the first direction with a predetermined pitch relative to the first and second global bit lines.

4. The semiconductor device according to claim 3, wherein the first and second operations are performed at a same timing, and the third and fourth operations are performed at a same timing.

5. The semiconductor device according to claim 4, wherein the first to fourth operations are a refresh operation in which at least data of the first to fourth memory cells is retained.

6. The semiconductor device according to claim 3, wherein the first sense amplifier is disposed at one end of the memory cell array in the first direction, and the second sense amplifier is disposed at the other end of the memory cell array in the first direction.

7. The semiconductor device according to claim 6,
wherein the first sense amplifier is shared by the first and third global bit lines belonging to a first memory cell array and is shared by the second and fourth global bit lines belonging to a second memory cell array, the first and second memory cell arrays being adjacent to the first sense amplifier on both sides,
and the second sense amplifier is shared by the second and fourth global bit lines belonging to the first memory cell array and is shared by the first and third global bit lines belonging to a third memory cell array, the first and third memory cell arrays being adjacent to the second sense amplifier on both sides.

8. The semiconductor device according to claim 1,
wherein each of the first and second switches comprises one transistor controlled by a gate voltage,
and each of the third and fourth switches comprises two transistors controlled by gate voltages different from each other.

9. A semiconductor device comprising a single-ended memory cell array configured with hierarchical local bit lines and global bit lines, the device comprising:
first to fourth local bit lines respectively transmitting first to fourth signals corresponding to first to forth memory cells that are selected simultaneously;
first to fourth global bit lines respectively corresponding to the first to fourth local bit lines;
a first switch controlling a connection between one end of the first global bit line and one end of the second global bit line;
a second switch controlling a connection between one end of the third global bit line and one end of the fourth global bit line;
first and second global sense amplifiers;
a third switch selectively connecting one of the other ends of the first and third global bit lines to the first global sense amplifier;
a fourth switch selectively connecting one of the other ends of the second and fourth global bit lines to the second global sense amplifier;
first to fourth local sense amplifiers respectively connected to the first to fourth local bit lines;
fifth to eighth switches controlling connections between output nodes of the first to fourth local sense amplifiers and the first to fourth global bit lines respectively; and
a control circuit controlling the first to eighth switches,
wherein the first and third global bit lines are physically adjacent to each other and the second and fourth global bit lines are physically adjacent to each other,
in a first period, the control circuit performs a first operation in which the first global sense amplifier amplifies the first signal and a second operation in which the second global sense amplifier amplifies the second signal, the first and second operations being performed in a state where the first and second global bit lines are electrically disconnected from each other by the first switch, the third and fourth global bit lines are electrically connected to each other via the second switch, the fifth and sixth switches become conductive, the seventh and eighth switches become non-conductive, the third and fourth global bit lines are set to a predetermined potential, the first global bit line is electrically connected to the first global sense amplifier via the third switch, and the second global bit line is electrically connected to the second global sense amplifier via the fourth switch, and in a second period different from the first period, the control circuit further performs a third operation in which the first global sense amplifier amplifies the third signal and a fourth operation in which the second global sense amplifier amplifies the fourth signal, the third and fourth operations being performed in a state where the first and second global bit lines are electrically connected to each other via the first switch, the third and fourth global bit lines are electrically disconnected from each other by the second switch, the seventh and eighth switches become conductive, the fifth and sixth switches become non-conductive, the first and second global bit lines are set to the predetermined potential, the third global bit line is electrically connected to the first global sense amplifier via the third switch, and the fourth global bit line is electrically connected to the second global sense amplifier via the fourth switch.

10. The semiconductor device according to claim 9 further comprising:
a first precharge circuit supplying a first precharge voltage as the predetermined potential to at least one of the first and second global bit lines, and
a second precharge circuit supplying the first precharge voltage to at least one of the third and fourth global bit lines,
wherein in a first precharge period prior to the first period, the first precharge circuit supplies the first precharge voltage to the first and second global bit lines via the first switch,
and in a second precharge period subsequent to the first period and prior to the second period, the second precharge circuit supplies the first precharge voltage to the third and fourth global bit lines via the second switch.

11. The semiconductor device according to claim 10, wherein the first and second global bit lines are arranged along a same line in a first direction, and the third and fourth global bit lines are arranged along the same line in the first direction with a predetermined pitch relative to the first and second global bit lines.

12. The semiconductor device according to claim 11, wherein the first and second operations are performed at a same timing, and the third and fourth operations are performed at a same timing.

13. The semiconductor device according to claim 12, wherein the first to fourth operations are a refresh operation in which at least data of the first to fourth memory cells is retained.

14. A semiconductor device comprising a memory cell array comprising an open bit line structure configured with hierarchical local bit lines and global bit lines, the device comprising:
first to fourth local bit lines respectively transmitting first to fourth signals corresponding to first to forth memory cells that are selected simultaneously;
first to fourth global bit lines respectively corresponding to the first to fourth local bit lines;
a first switch controlling a connection between one end of the first global bit line and one end of the second global bit line;
a second switch controlling a connection between one end of the third global bit line and one end of the fourth global bit line;
first and second sense amplifiers of a difference amplifier type;
a third switch selectively connecting one of the other ends of the first and third global bit lines to the first sense amplifier;
a fourth switch selectively connecting one of the other ends of the second and fourth global bit lines to the second sense amplifier;
fifth to eighth switches controlling connections between one ends of the first to fourth local bit lines and the first to fourth global bit lines respectively; and
a control circuit controlling the first to eighth switches,
wherein the first and third global bit lines are physically adjacent to each other and the second and fourth global bit lines are physically adjacent to each other,
the first sense amplifier senses a differential voltage between one of the first and third global bit lines included in a first memory cell array and one of the second and fourth global bit lines included in a second memory cell array, the first and second memory cell arrays being adjacent to the first sense amplifier on both sides,
the second sense amplifier senses a differential voltage between one of the second and fourth global bit lines included in the first memory cell array and one of the first and third global bit lines included in a third memory cell array, the first and third memory cell arrays being adjacent to the second sense amplifier on both sides,
in a first period, the control circuit performs a first operation in which the first sense amplifier amplifies the first signal via the fifth switch and a second operation in which the second sense amplifier amplifies the second signal via the sixth switch, the first and second operations being performed in a state where the first and second global bit lines are electrically disconnected from each other by the first switch, the third and fourth global bit lines are electrically connected to each other via the second switch, the fifth and sixth switches become conductive, the seventh and eighth switches become non-conductive, the third and fourth global bit lines are set to a predetermined potential, the first global bit line is electrically connected to the first sense amplifier via the third switch, and the second global bit line is electrically connected to the second sense amplifier via the fourth switch,
and in a second period different from the first period, the control circuit further performs a third operation in which the first sense amplifier amplifies the third signal via the seventh switch and a fourth operation in which the second sense amplifier amplifies the fourth signal via the eighth switch, the first and second operations being performed in a state where the first and second global bit lines are electrically connected to each other via the first switch, the third and fourth global bit lines are electrically disconnected from each other by the second switch, the seventh and eighth switches become conductive, the fifth and sixth switches become non-conductive, the first and second global bit lines are set to the predetermined potential, the third global bit line is electrically connected to the first sense amplifier via the third switch, and the fourth global bit line is electrically connected to the second sense amplifier via the fourth switch.

15. The semiconductor device according to claim 14 further comprising:
a first precharge circuit supplying a first precharge voltage as the predetermined potential to at least one of the first and second global bit lines, and
a second precharge circuit supplying the first precharge voltage to at least one of the third and fourth global bit lines,
wherein in a first precharge period prior to the first period, the first precharge circuit supplies the first precharge voltage to the first and second global bit lines via the first switch,
and in a second precharge period subsequent to the first period and prior to the second period, the second precharge circuit supplies the first precharge voltage to the third and fourth global bit lines via the second switch.

16. The semiconductor device according to claim 15, wherein the first and second global bit lines are arranged along a same line in a first direction, and the third and fourth global bit lines are arranged along a same line in the first direction with a predetermined pitch relative to the first and second global bit lines.

17. The semiconductor device according to claim 16, wherein the first and second operations are performed at a same timing, and the third and fourth operations are performed at a same timing.

18. The semiconductor device according to claim 17, wherein the first to fourth operations are a refresh operation in which at least data of the first to fourth memory cells is retained.

* * * * *